United States Patent
Bai

(10) Patent No.: US 8,634,494 B2
(45) Date of Patent: Jan. 21, 2014

(54) BANDPASS SAMPLING SCHEMES FOR OBSERVATION RECEIVER FOR USE IN PA DPD SYSTEM FOR CONCURRENT MULTI-BAND SIGNALS

(75) Inventor: Chunlong Bai, Kanata (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 35 days.

(21) Appl. No.: 13/423,846

(22) Filed: Mar. 19, 2012

(65) Prior Publication Data

US 2013/0243121 A1    Sep. 19, 2013

(51) Int. Cl.
*H04K 1/02* (2006.01)
*H04L 25/03* (2006.01)
*H04L 25/49* (2006.01)

(52) U.S. Cl.
USPC ............................ 375/297; 375/295; 375/296

(58) Field of Classification Search
USPC ......................................................... 375/297
See application file for complete search history.

(56) References Cited

U.S. PATENT DOCUMENTS

| | | | |
|---|---|---|---|
| 7,181,199 B2* | 2/2007 | Sorrells ...................... | 455/414.1 |
| 8,223,881 B2* | 7/2012 | Meyer et al. .................. | 375/295 |
| 8,380,144 B1 | 2/2013 | Bai et al. | |
| 2004/0219894 A1* | 11/2004 | Sorrells ......................... | 455/118 |
| 2006/0025099 A1* | 2/2006 | Jung et al. ..................... | 455/313 |
| 2006/0109920 A1* | 5/2006 | Sato .............................. | 375/260 |
| 2007/0076804 A1* | 4/2007 | Sestok et al. .................. | 375/260 |
| 2009/0046803 A1* | 2/2009 | Meyer et al. .................. | 375/295 |
| 2009/0285336 A1* | 11/2009 | Pugel et al. .................... | 375/340 |

OTHER PUBLICATIONS

Cidronali, A. et al., "A new approach for concurrent dual-band IF digital predistortion: system design and analysis," Workshop on Integrated Nonlinear Microwave and Millimetre-Wave Circuits, Nov. 24-25, 2008, pp. 127-130.
Cidronali, A. "Dual-band power amplifiers for WiMAX and WCDMA applications," Target Days 2007, Rome, Italy, Dec. 16-17, 2007, 51 pages, accessed Jun. 27, 2012, www.unifi.it/miclab/upload/sub/ricerca/highlightsTARGET.pdf.
Tseng, Ching-Hsiang et al., "Direct Downconversion of Multiband RF Signals Using Bandpass Sampling," IEEE Transactions on Wireless Communications, vol. 5, No. 1, Jan. 2006, pp. 72-76.
Lin, Yuan-Pei et al., "A New Iterative Algorithm for Finding the Minimum Sampling Frequency of MultiBand Signals," IEEE Transactions on Signal Processing, vol. 58, No. 10, Oct. 2010, pp. 5446-5450.

(Continued)

*Primary Examiner* — Erin File
(74) *Attorney, Agent, or Firm* — Withrow & Terranova, PLLC

(57) ABSTRACT

The present disclosure relates to an undersampling observation receiver for use in a power amplifier digital predistortion system for concurrent multi-band signals. In one embodiment, an undersampling observation receiver receives a concurrent multi-band signal output by a power amplifier. The concurrent multi-band output signal includes multiple original frequency bands. The
undersampling observation receiver undersamples the concurrent multi-band signal at a select sampling rate to provide an undersampled multi-band signal. The select sampling rate is such that a frequency-flipped image of at least one of the original frequency bands and images of any remaining original frequency bands fall within a frequency range of zero to half of the select sampling rate and do not overlap one another.

20 Claims, 15 Drawing Sheets

(56) References Cited

OTHER PUBLICATIONS

Park, Youngcheol et al., "Adaptive Predistortion Linearization of RF Power Amplifiers Using Lookup Tables Generated from Subsampled Data," IEEE Radio and Wireless Conference, Aug. 11, 2002, pp. 233-236.

Sun, Ji et al., "A Direct RF-Undersampling Retrodirective Array System," 2008 IEEE Radio and Wireless Symposium, Jan. 22, 2008, pp. 631-634.

International Search Report and Written Opinion for PCT/IB2013/051753, mailed Jul. 18, 2013, 15 pages.

* cited by examiner

BANDPASS SAMPLING SCHEMES FOR OBSERVATION RECEIVER FOR USE IN PA DPD SYSTEM FOR CONCURRENT MULTI-BAND SIGNALS

FIELD OF THE DISCLOSURE

The present disclosure relates to digital predistortion to compensate for non-linearity of a power amplifier and more particularly relates to embodiments of a bandpass sampling, or undersampling, observation receiver utilized in a feedback path that adaptively configures digital predistortion in a power amplifier digital predistortion system for concurrent multi-band signals.

BACKGROUND

A radio system generally includes a transmitter that transmits information-carrying signals to a receiver. The transmitter includes a power amplifier that operates to amplify the signal to be transmitted to a power level that is sufficient to enable receipt of the signal by the receiver. The power amplifier is an active radio frequency sub-system. As such, it is desirable for the power amplifier sub-system to simultaneously achieve both high efficiency and high linearity. However in many applications such as, for example, wireless base station applications, designing power amplifier sub-systems that achieve both high efficiency and high linearity is especially challenging due to high peak to average ratio of the signal due to the use of advanced modulation schemes (e.g., high order Quadrature Amplitude Modulation (QAM), Orthogonal Frequency Division Multiplexing (OFDM), and Code Division Multiple Access (CDMA)) used in current and future wireless communication system standards and the strict requirements on out-of-band emissions imposed by current and future wireless communication system standards.

Adaptive digital predistortion to compensate for the non-linearity of the power amplifier is a proven technology that enables high linearity, high efficiency power amplifier sub-systems. Adaptive digital predistortion requires a feedback path to provide a feedback signal from the output of the power amplifier in order to close the adaptation loop. It is desirable to design the feedback path with minimum cost in terms of hardware and power consumption. However, the predistorted signal exhibits bandwidth expansion on the same order as the distorted signal without predistortion. For instance, if third-order intermodulation distortion (IM3) is the primary distortion to be counteracted, the predistorted signal occupies three times the bandwidth of the original, or input, signal prior to predistortion. Similarly, if fifth-order intermodulation distortion (IM5) is significant and is desired to be counteracted, the predistorted signal occupies five times the bandwidth of the original, or input, signal prior to predistortion. Still further, if higher order intermodulation distortion is desired to be counteracted, the predistorted signal occupies even greater bandwidth.

As the bandwidth of the original, or input, signal prior to predistortion increases, a sampling rate needed to process the predistorted signal approaches or exceeds a clock rate limit that current Integrated Circuit (IC) technology can support. Generally, there are two approaches to address this issue. The first approach is to apply signal processing techniques to support a sampling rate that is higher than the IC clock rate. The second approach is to seek technologies that reduce the required sampling rate. Regarding this second approach, there is a need for systems and methods for reducing the required sampling rate for processing the predistorted signal particularly in the feedback path.

SUMMARY

The present disclosure relates to an undersampling observation receiver for use in a power amplifier digital predistortion system for concurrent multi-band signals. In one embodiment, an undersampling observation receiver receives a concurrent multi-band signal output by a power amplifier. The concurrent multi-band signal includes multiple original frequency bands. The undersampling observation receiver undersamples the concurrent multi-band signal at a select sampling rate to provide an undersampled multi-band signal. The select sampling rate is such that a frequency-flipped image of at least one of the original frequency bands and images of any remaining original frequency bands fall within a frequency range of zero to half of the select sampling rate and do not overlap one another. The undersampled multi-band signal is then processed to provide a different feedback signal for each of the original frequency bands of the concurrent multi-band signal. An adaptation sub-system adaptively configures a predistortion sub-system that effects predistortion to compensate for non-linearity of the power amplifier based on the feedback signals for the original frequency bands of the concurrent multi-band signal.

In another embodiment, an undersampling observation receiver receives a concurrent multi-band signal output by a power amplifier. The concurrent multi-band signal includes multiple original frequency bands and multiple distortion frequency bands. The undersampling observation receiver undersamples the concurrent multi-band signal at a select sampling rate to provide an undersampled multi-band signal. The select sampling rate is such that a frequency-flipped image of at least one of the original frequency bands and images of any remaining original frequency bands fall within a frequency range of zero to half of the select sampling rate and do not overlap one another. In addition, the select sampling rate is such that images and frequency-flipped images of the distortion frequency bands do not alias into the frequency-flipped image of the at least one of the original frequency bands or the images of any of the remaining original frequency bands that fall within the frequency range of zero to half of the select sampling rate. The undersampled multi-band signal is then processed to provide a different feedback signal for each of the original frequency bands of the concurrent multi-band signal. An adaptation sub-system adaptively configures a predistortion sub-system that effects predistortion to compensate for non-linearity of the power amplifier based on the feedback signals for the original frequency bands of the concurrent multi-band signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 is a block diagram of a concurrent multi-band transmitter that includes an undersampling observation receiver according to one embodiment of the present disclosure;

FIGS. 2A and 2B graphically depict selection of a sampling rate for an undersampling observation receiver such that either an image or a frequency-flipped image of all original frequency bands of a concurrent multi-band signal fall within a frequency range of zero to half of the sampling rate according to one exemplary and non-limiting embodiment of the present disclosure;

Figure 9A:
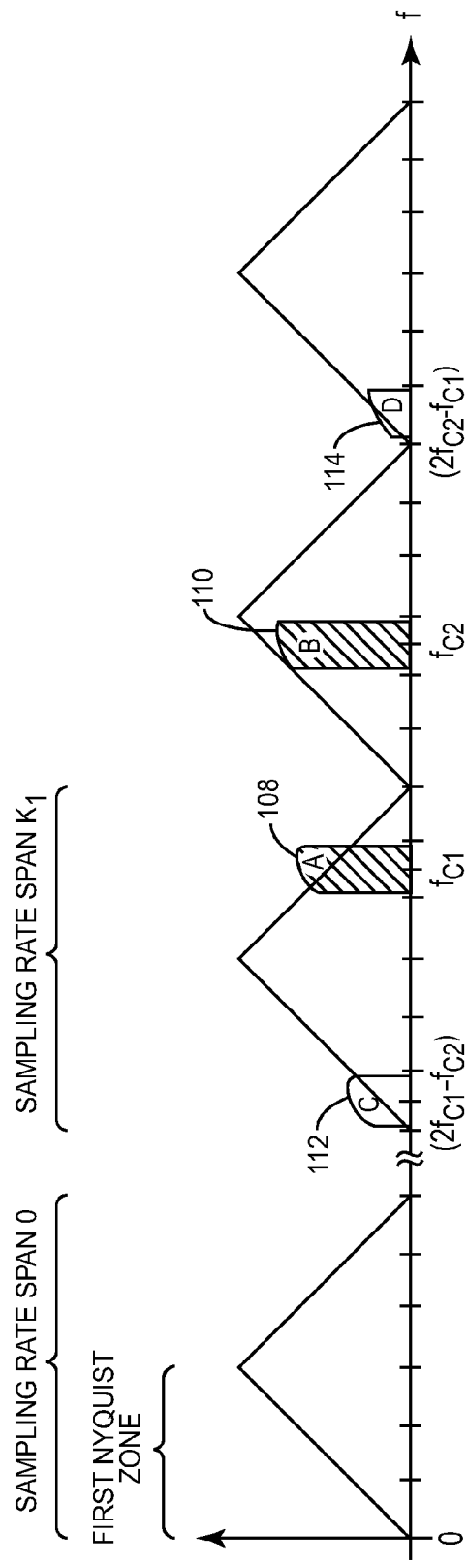
Figure 9B:
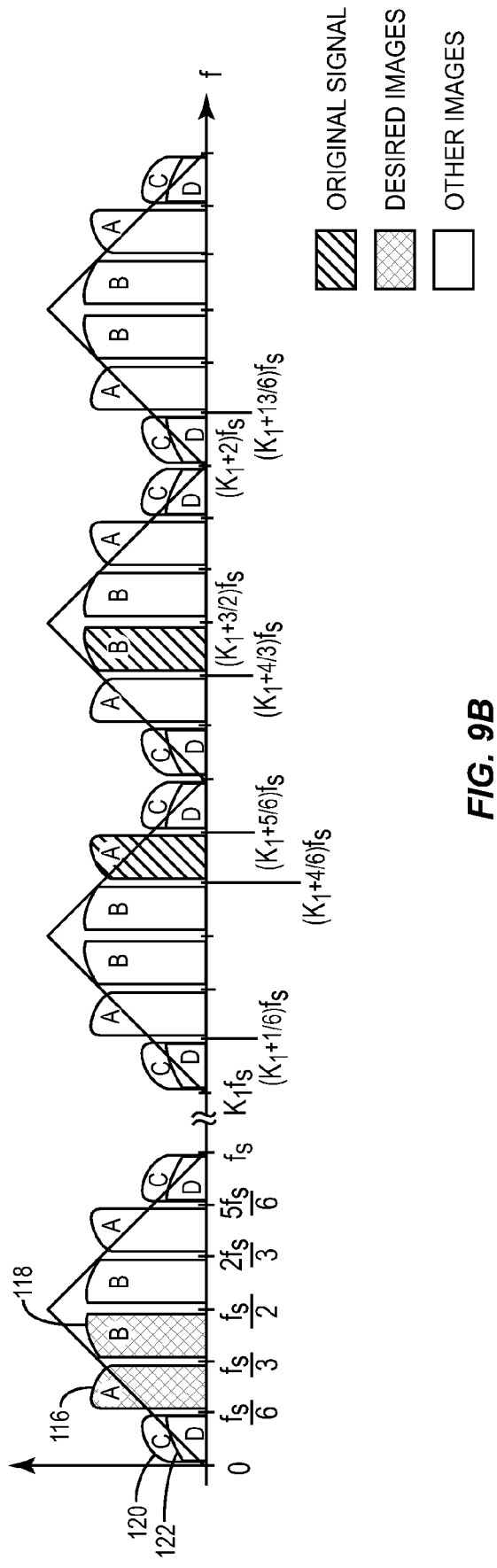
Figure 10:
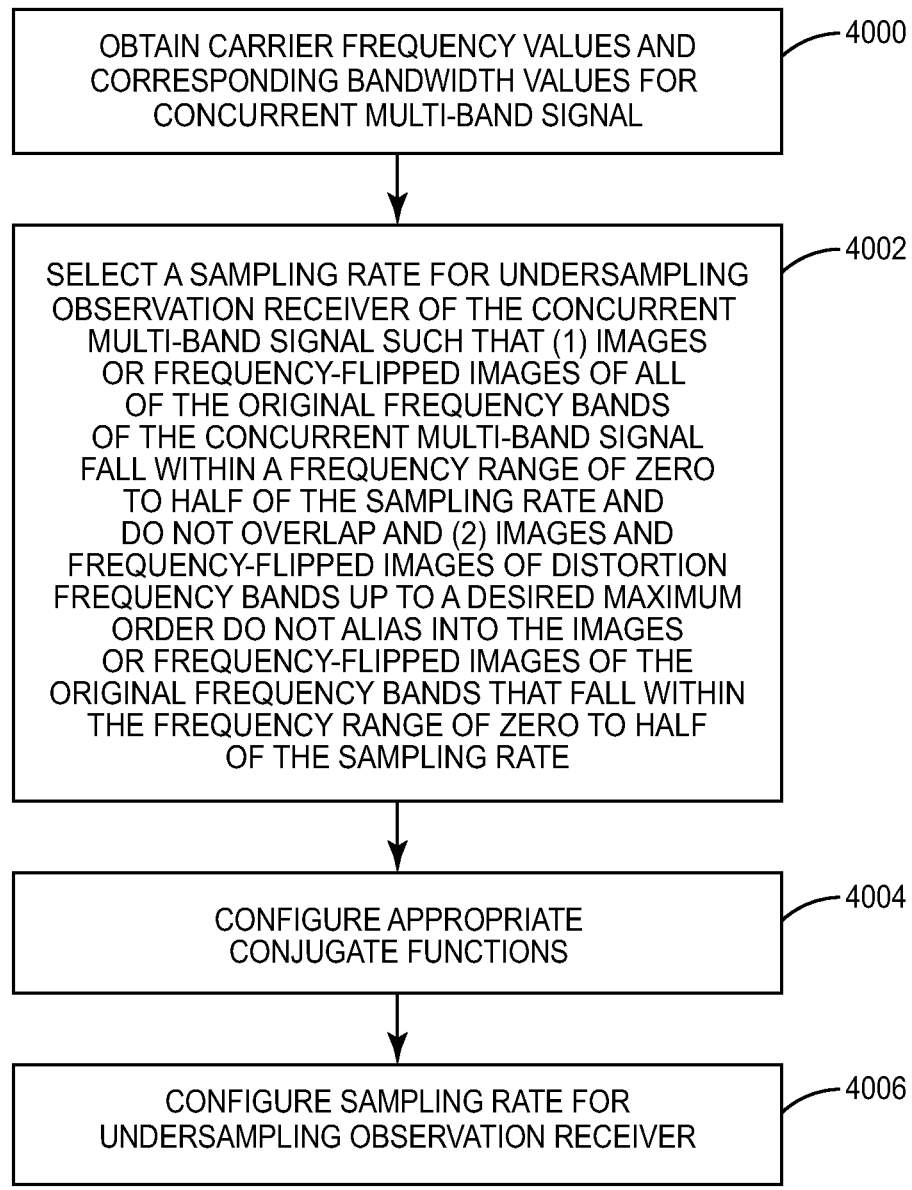
Figure 11:
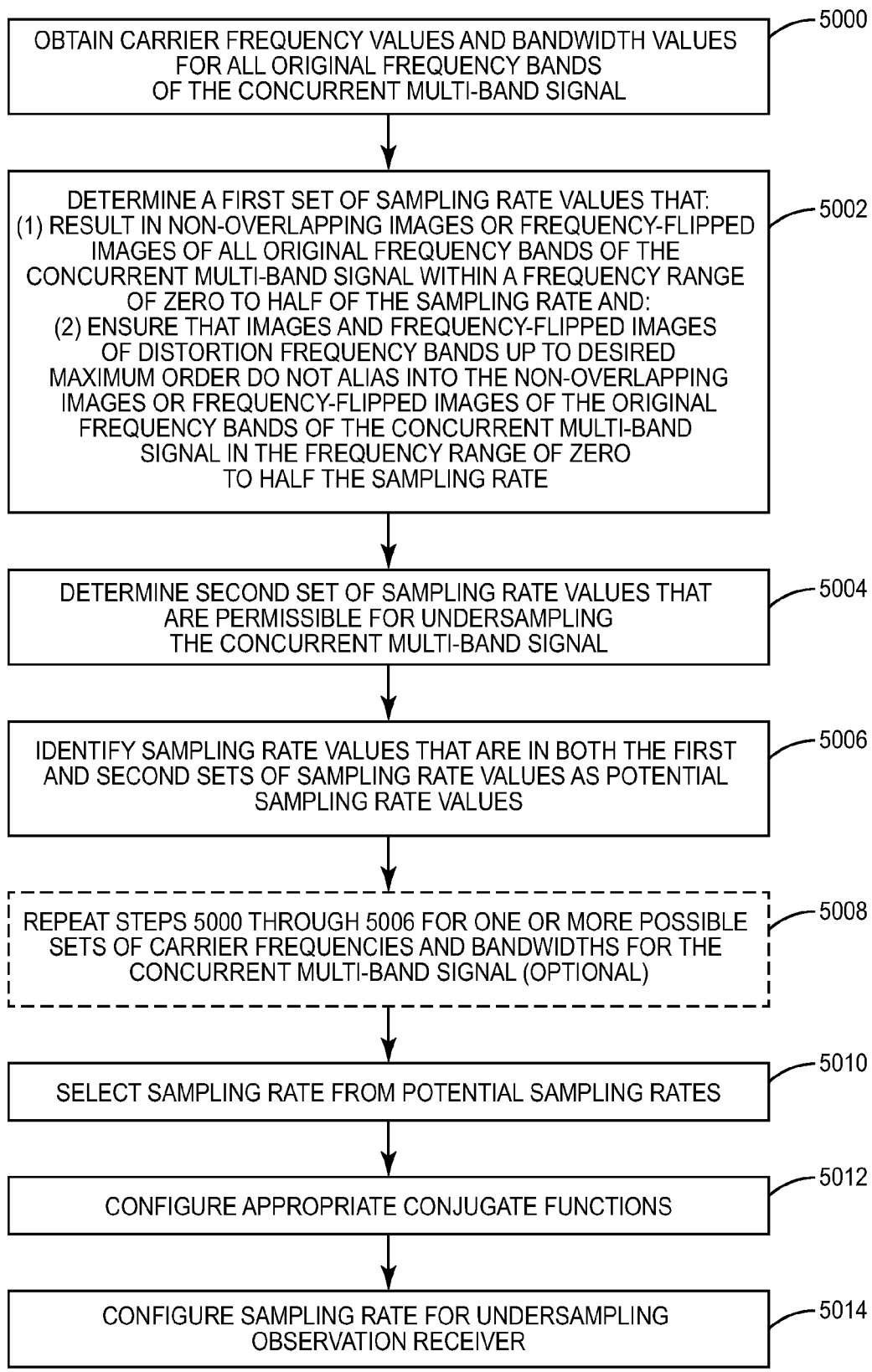
Figure 12A:
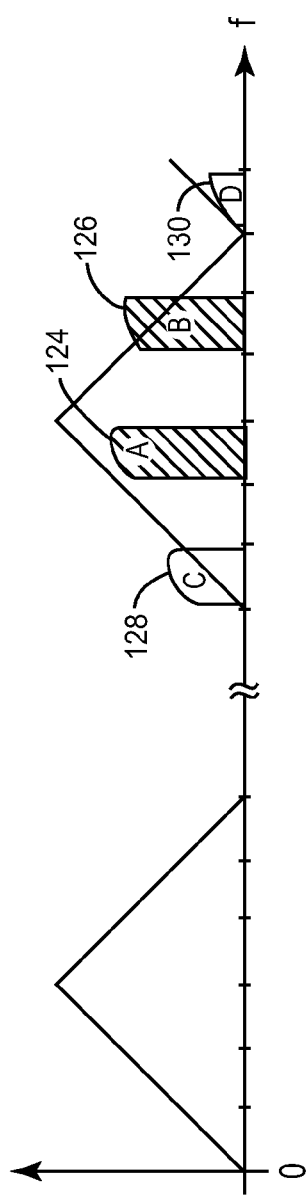
Figure 12B:
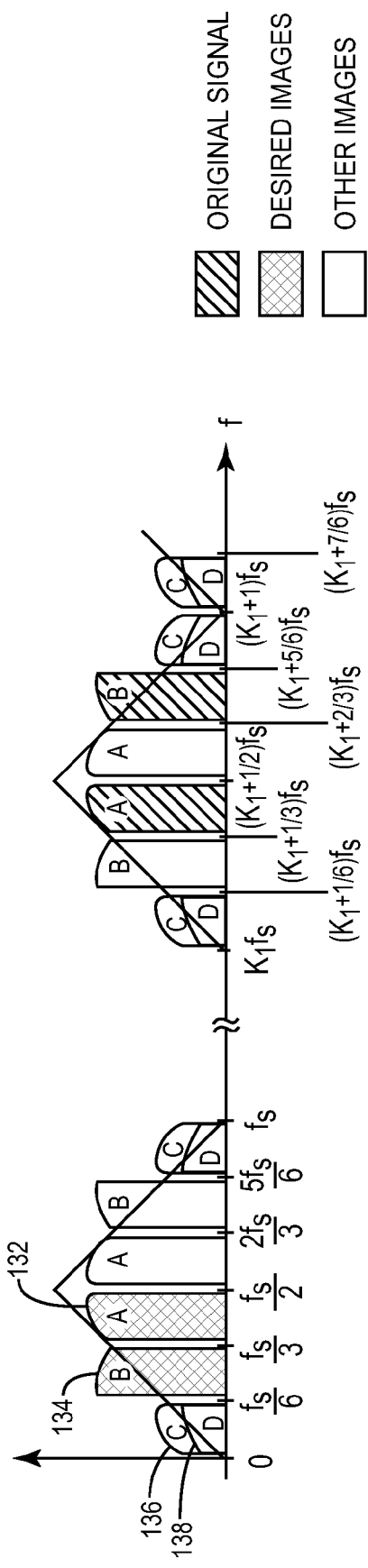
Figure 13:
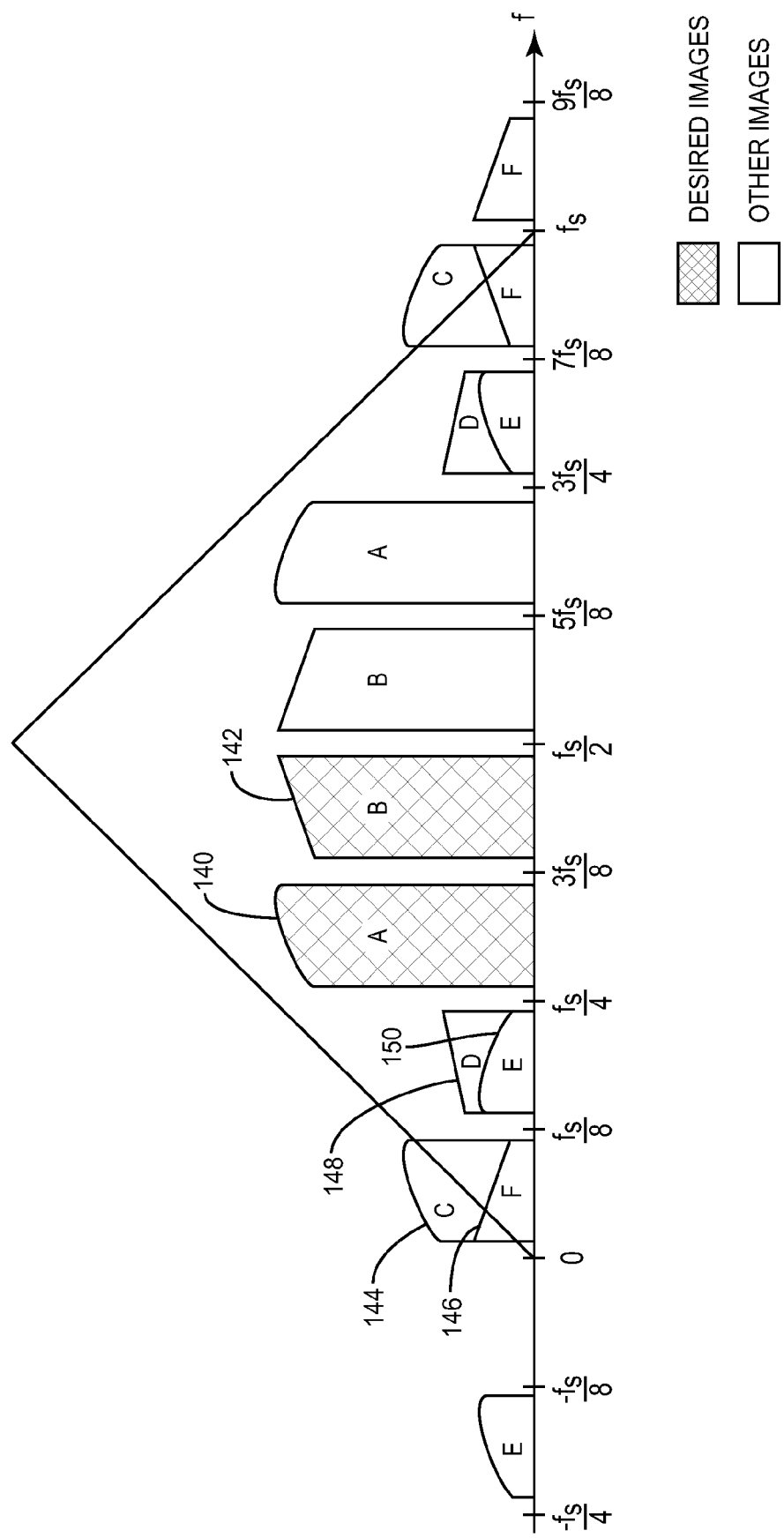

FIGS. 9A and 9B graphically depict selection of a sampling rate of an undersampling observation receiver such that either an image or a frequency-flipped image of all original frequency bands of a concurrent multi-band signal fall within a frequency range of zero to half of the sampling rate and images and frequency-flipped images of distortion up to a desired maximum order do not alias into the images or frequency-flipped images of any of the original frequency bands that fall within the frequency range of zero to half of the sampling rate according to one exemplary and non-limiting embodiment of the present disclosure;

FIG. 10 illustrates a process for selecting a sampling rate for an undersampling observation receiver such that either an image or a frequency-flipped image of all original frequency bands of a concurrent multi-band signal fall within a frequency range of zero to half of the sampling rate and images and frequency-flipped images of distortion up to a desired maximum order do not alias into the images or frequency-flipped images of any of the original frequency bands that fall within the frequency range of zero to half of the sampling rate according to one embodiment of the present disclosure;

FIG. 11 illustrates a process for selecting a sampling rate for an undersampling observation receiver such that either an image or a frequency-flipped image of all original frequency bands of a concurrent multi-band signal fall within a frequency range of zero to half of the sampling rate and images and frequency-flipped images of distortion up to a desired maximum order do not alias into the images or frequency-flipped images of any of the original frequency bands that fall within the frequency range of zero to half of the sampling rate according to another embodiment of the present disclosure;

FIGS. 12A and 12B graphically depict selection of a sampling rate of an undersampling observation receiver such that either an image or a frequency-flipped image of all original frequency bands of a concurrent multi-band signal fall within a frequency range of zero to half of the sampling rate and images and frequency-flipped images of distortion up to a desired maximum order do not alias into the images or frequency-flipped images of any of the original frequency bands that fall within the frequency range of zero to half of the sampling rate according to another exemplary and non-limiting embodiment of the present disclosure; and FIG. 13 graphically depicts selection of a sampling rate of an undersampling observation receiver such that either an image or a frequency-flipped image of all original frequency bands of a concurrent multi-band signal fall within a frequency range of zero to half of the sampling rate and images and frequency-flipped images of distortion up to a desired maximum order do not alias into the images or frequency-flipped images of any of the original frequency bands that fall within the frequency range of zero to half of the sampling rate according to one exemplary and non-limiting embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to digital predistortion to compensate for power amplifier non-linearity for a concurrent multi-band signal. In general, the concurrent multi-band signal contains frequency components occupying multiple frequency bands (i.e., a first continuous frequency band, a second continuous frequency band, etc.) with no frequency components between adjacent frequency bands. These frequency bands are referred to herein as "original frequency bands" of the concurrent multi-band signal. In one embodiment, the concurrent multi-band signal includes two original frequency bands and, as such, is also referred to herein as a concurrent dual-band signal.

For each original frequency band of the concurrent multi-band signal, a center frequency of the original frequency band is referred to herein as a carrier frequency of the concurrent multi-band signal. As such, the concurrent multi-band signal as defined herein includes multiple carrier frequencies. Frequency differences between adjacent carrier frequencies of the concurrent multi-band signal are referred to herein as carrier frequency spacings. A ratio of the carrier frequency spacing over a maximum individual baseband bandwidth (i.e., the maximum individual baseband bandwidth is a maximum bandwidth among the baseband signals that correspond to the original frequency bands of the concurrent multi-band signal) is high such that a distortion or predistortion surrounding each of the carrier frequencies also occupies disjoint frequency bands. Some examples of situations or applications where such concurrent multi-band signals are used include multi-standard systems where each standard occupies a different frequency band, systems that transmit signals for multiple standards simultaneously, and systems having concurrent transmissions in multiple frequency bands for the same standard.

Figure 1:
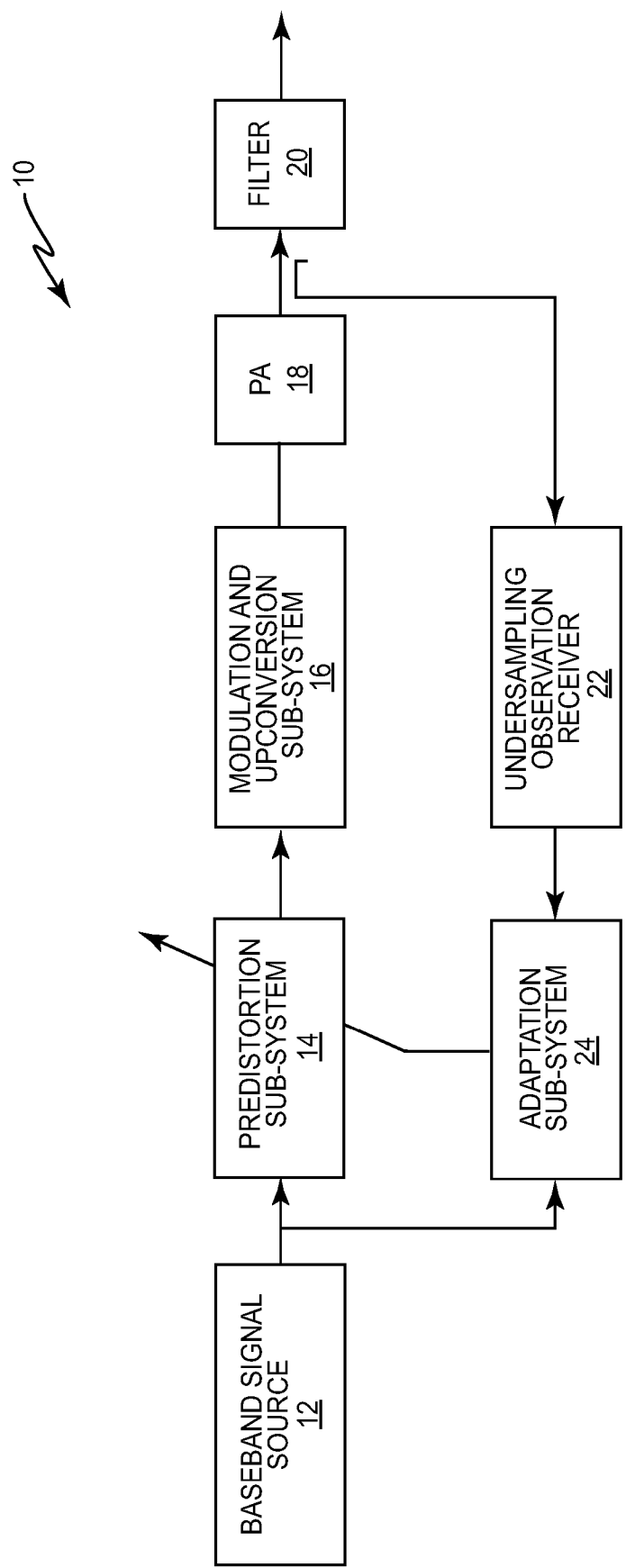

FIG. 1 illustrates a transmitter 10 that provides predistortion for a concurrent multi-band signal according to one embodiment of the present disclosure. The transmitter 10 is preferably a wireless transmitter such as a wireless transmitter that enables wireless communication in a cellular communications network. However, the transmitter 10 is not limited thereto. As illustrated, the transmitter 10 includes a transmit path including a baseband signal source 12, a predistortion sub-system 14, a modulation and upconversion sub-system 16, a power amplifier (PA) 18, and a filter 20 connected as shown. The transmitter 10 also includes a feedback path including an undersampling observation receiver 22 and an adaptation sub-system 24 connected as shown.

In general, the transmit path operates to transmit a concurrent multi-band signal, where the predistortion sub-system 14 compensates for non-linearity of the power amplifier 18. The feedback path operates to process the concurrent multi-band signal output by the power amplifier 18 to adaptively configure the predistortion sub-system 14.

More specifically, the baseband signal source 12 outputs a number of baseband signals. Each of the baseband signals is a baseband signal for a different one of the original frequency bands of the concurrent multi-band signal to be transmitted by the transmitter 10. Thus, for example, if the concurrent multi-band signal is a concurrent dual-band signal having two original frequency bands, then the baseband signal source 12 outputs two baseband signals, one for each of the two original frequency bands of the concurrent dual-band signal.

The predistortion sub-system 14 predistorts the baseband signals from the baseband signal source 12 to provide one or more predistorted signals. As discussed below, in one embodiment, the baseband signals are predistorted separately, and the predistortion sub-system 14 outputs a separate predistorted signal for each of the original frequency bands of the concurrent multi-band signal. In another embodiment, the predistortion sub-system 14 combines the baseband signals for the original frequency bands and predistorts the resulting combined signal to provide a combined predistorted signal. In either embodiment, the modulation and upconversion sub-system 16 modulates and up-converts the one or more predistorted signals to provide a modulated concurrent multi-band signal that is predistorted to compensate for the non-linearity of the power amplifier 18. The modulated concurrent multi-band signal is then amplified by the power amplifier 18 to provide an amplified concurrent multi-band signal to be transmitted by the transmitter 10. The amplified concurrent multi-band signal is referred to herein as the concurrent multi-band signal. The filter 20 then filters the concurrent multi-band signal to remove undesired frequency components to provide a filtered concurrent multi-band signal that is ultimately transmitted by the transmitter 10.

The undersampling observation receiver 22 receives the concurrent multi-band signal from the output of the power amplifier 18. The undersampling observation receiver 22 preferably obtains the concurrent multi-band signal via a coupler. Using a bandpass sampling, or undersampling, technique, the undersampling observation receiver 22 processes the concurrent multi-band signal to provide a separate undersampled feedback signal for each original frequency band of the concurrent multi-band signal. A sampling rate of the undersampling observation receiver 22 is selected such that either an image or a frequency-flipped image of each of the original frequency bands falls within a frequency range of zero to half of the sampling rate (i.e., the Nyquist rate) and do not overlap one another. The undersampling observation receiver 22 samples the concurrent multi-band signal at the selected sampling rate. Due to the Nyquist sampling theorem, the resulting undersampled signal includes either an image or a frequency-flipped image of each of the original frequency bands that falls within the frequency range of zero to half of the sampling rate.

Then, for each original frequency band, the undersampling observation receiver 22 performs appropriate filtering to obtain the image or frequency-flipped image for the original frequency band that falls within the frequency range of zero to half of the sampling rate. For any frequency-flipped images, the undersampling observation receiver 22 performs a complex conjugate operation of the frequency-flipped image to provide an image of the corresponding original frequency band of the concurrent multi-band signal. The undersampling observation receiver 22 provides digital signals that represent the images of the original frequency bands to the adaptation sub-system 24, where these digital signals are referred to herein as the undersampled feedback signals.

The adaptation sub-system 24 adaptively configures the predistortion sub-system 14 based on the undersampled feedback signals from the undersampling observation receiver 22. More specifically, the adaptation sub-system 24 adaptively configures one or more parameters (e.g., one or more sets of predistortion coefficients) input to the predistortion sub-system 14 based on the undersampled feedback signals and the baseband signals from the baseband signal source 12. The adaptation sub-system 24 may use any suitable adaptation technique. Before proceeding, it should be noted that the various components of the transmitter 10 are implemented in hardware or a combination of hardware and software. For instance, the predistortion sub-system 14, the undersampling observation receiver 22, and the adaptation sub-system 24 may be implemented using one or more Digital Signal Processors (DSPs), one or more Application Specific Integrated Circuits (ASICs), or the like, or any combination thereof.

Figure 2A:
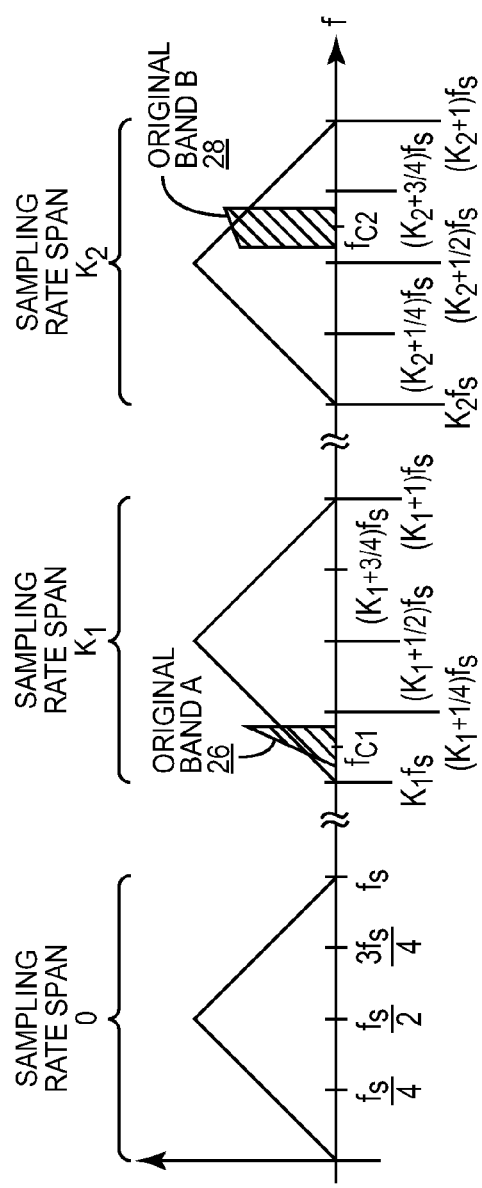
Figure 2B:
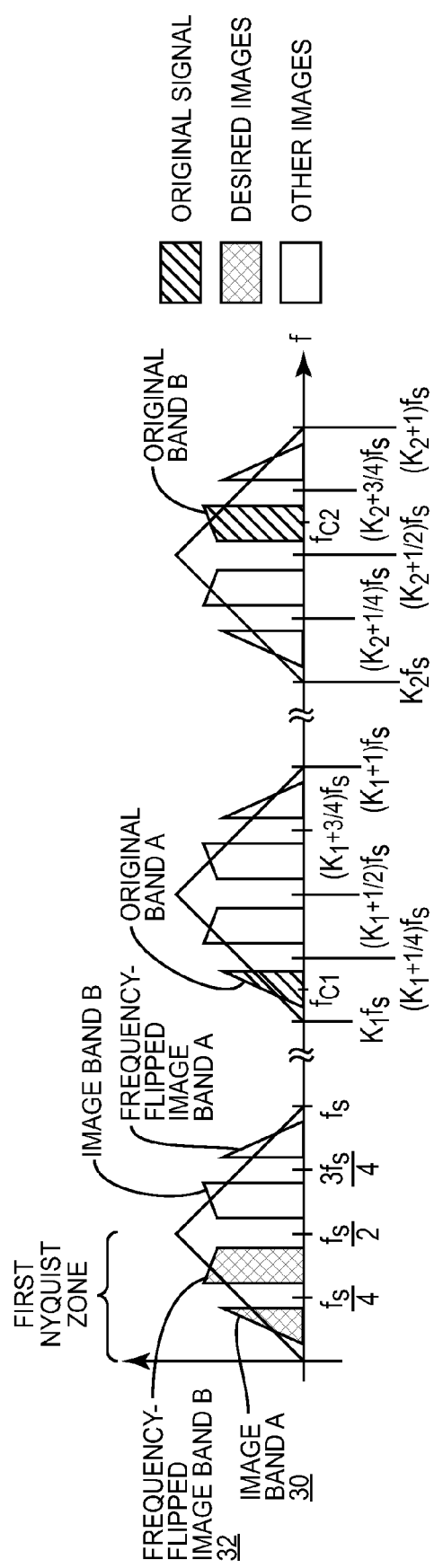

FIGS. 2A and 2B graphically depict selection of a sampling rate ($f_S$) of the undersampling observation receiver 22 such that either an image or a frequency-flipped image of all original frequency bands of the concurrent multi-band signal fall within the frequency range of zero to half of the sampling rate according to one exemplary and non-limiting embodiment of the present disclosure. More specifically, in this example, the concurrent multi-band signal, and thus the concurrent multi-band signal, is a concurrent dual-band signal having two original frequency bands. FIG. 2A illustrates one example of two original frequency bands 26 and 28 of the concurrent dual-band signal. As shown, the first original frequency band 26, which is referred to as original frequency band A, is centered at a first carrier frequency ($f_{C1}$), and the second original frequency band 28, which is referred to as original frequency band B, is centered at a second carrier frequency ($f_{C2}$).

In general, as illustrated in FIG. 2B, the sampling rate for the undersampling observation receiver 22 is selected such that, in this example, an image 30 of the first original frequency band 26 and a frequency-flipped image 32 of the second original frequency band 28 fall within a frequency range of zero to half of the sampling rate of the undersampling observation receiver 22 and do not overlap one another. More generally, the sampling rate of the undersampling observation receiver 22 is selected such that images or frequency-flipped images of all of the original frequency bands, which in this example are the original frequency bands 26 and 28, fall within the frequency range of zero to half the sampling rate and do not overlap with one another. Returning to this example, by sampling the dual-band signal at the selected sampling rate, due to the Nyquist theorem, the undersampling observation receiver 22 obtains an undersampled signal that includes both the image 30 of the first original frequency band 26 and the frequency-flipped image 32 of the second original frequency band 28. Filtering is then used to separate the image 30 and the frequency-flipped image 32. A complex conjugate operation is then performed on the frequency-flipped image 32 to obtain an image of the second original frequency band 28. In this manner, the undersampling observation receiver 22 obtains an undersampled feedback signal for each of the original frequency bands 26 and 28 of the concurrent dual-band signal.

For this exemplary embodiment, the sampling rate for the undersampling observation receiver 22 is selected according to the following constraints:

Constraint 1: The sampling rate ($f_S$) must be large enough to accommodate the images and frequency-flipped images of all of the original frequency bands within the frequency range of zero to the sampling rate ($f_S$) without aliasing, or overlap. This can be expressed as:

$$f_S \geq 2(bw_{IM3\_A} + bw_{IM3\_B}),$$

where:

$$bw_{IM3\_A} = bW_A + 2\max(bw_A + bw_B), \text{ and}$$

$$bw_{IM3\_B} = bW_B + 2\max(bw_A + bw_B),$$

where $bw_A$ and $bw_B$ denote bandwidths of the two original frequency bands 26 and 28 of the concurrent dual-band signal and $bw_{IM3\_A}$ and $bw_{IM3\_B}$ denote bandwidths of distorted signals in the two original frequency bands 26 and 28 of the concurrent dual-band signal considering up to third-order distortion terms.

Constraint 2: Either an image or a frequency-flipped image of one of the original frequency bands 26 or 28 must fall within the frequency range of 0 to $f_S/4$ and either an image or a frequency-flipped image of the other original frequency band 26 or 28 must fall within the frequency range of $f_S/4$ to $f_S/2$. Constraint 2 is satisfied when any one of the following constraints 2.1 through 2.8 below is satisfied.

Constraint 2.1: An image of the first original frequency band 26 fully falls within the frequency range of 0 to $f_S/4$ and an image of the second original frequency band 28 fully falls within the frequency range of $f_S/4$ to $f_S/2$. Constraint 2.1 can be expressed as:

$$k_1 f_S \leq f_{C1} - \frac{1}{2}bw_{IM3\_A} \leq f_{C1} + \frac{1}{2}bw_{IM3\_A} \leq \left(k_1 + \frac{1}{4}\right)f_S,$$

and $$\left(k_2 + \frac{1}{4}\right)f_S \leq f_{C2} - \frac{1}{2}bw_{IM3\_B} \leq f_{C2} + \frac{1}{2}bw_{IM3\_B} \leq \left(k_2 + \frac{1}{2}\right)f_S,$$

where $k_1$ is a non-negative integer and is an index of a sampling rate span in which the first carrier frequency ($f_{C1}$) falls, and where $k_2$ is a non-negative integer and is an index of a sampling rate span in which the second carrier frequency ($f_{C2}$) falls.

Constraint 2.2: An image of the second original frequency band 28 fully falls within the frequency range of 0 to $f_S/4$ and an image of the first original frequency band 26 fully falls within the frequency range of $f_S/4$ to $f_S/2$. Constraint 2.2 can be expressed as:

$$k_1 f_S \leq f_{C2} - \frac{1}{2}bw_{IM3\_B} \leq f_{C2} + \frac{1}{2}bw_{IM3\_B} \leq \left(k_1 + \frac{1}{4}\right)f_S,$$

and $$\left(k_2 + \frac{1}{4}\right)f_S \leq f_{C1} - \frac{1}{2}bw_{IM3\_A} \leq f_{C1} + \frac{1}{2}bw_{IM3\_A} \leq \left(k_2 + \frac{1}{2}\right)f_S.$$

Constraint 2.3: A frequency-flipped image of the first original frequency band 26 fully falls within the frequency range of 0 to $f_S/4$ and an image of the second original frequency band 28 fully falls within the frequency range of $f_S/4$ to $f_S/2$. Constraint 2.3 can be expressed as:

$$\left(k_1 + \frac{3}{4}\right)f_S \leq f_{C1} - \frac{1}{2}bw_{IM3\_A} \leq f_{C1} + \frac{1}{2}bw_{IM3\_A} \leq (k_1 + 1)f_S,$$

and $$\left(k_2 + \frac{1}{4}\right)f_S \leq f_{C2} - \frac{1}{2}bw_{IM3\_B} \leq f_{C2} + \frac{1}{2}bw_{IM3\_B} \leq \left(k_2 + \frac{1}{2}\right)f_S.$$

Constraint 2.4: An image of the first original frequency band 26 fully falls within the frequency range of 0 to $f_S/4$ and a frequency-flipped image of the second original frequency band 28 fully falls within the frequency range of $f_S/4$ to $f_S/2$. Constraint 2.4 can be expressed as:

$$k_1 f_S \leq f_{C1} - \frac{1}{2}bw_{IM3\_A} \leq f_{C1} + \frac{1}{2}bw_{IM3\_A} \leq \left(k_1 + \frac{1}{4}\right)f_S,$$

and $$\left(k_2 + \frac{1}{2}\right)f_S \leq f_{C2} - \frac{1}{2}bw_{IM3\_B} \leq f_{C2} + \frac{1}{2}bw_{IM3\_B} \leq \left(k_2 + \frac{3}{4}\right)f_S.$$

Constraint 2.5: A frequency-flipped image of the first original frequency band 26 fully falls within the frequency range of 0 to $f_S/4$ and a frequency-flipped image of the second original frequency band 28 fully falls within the frequency range of $f_S/4$ to $f_S/2$. Constraint 2.5 can be expressed as:

$$\left(k_1 + \frac{3}{4}\right)f_S \leq f_{C1} - \frac{1}{2}bw_{IM3\_A} \leq f_{C1} + \frac{1}{2}bw_{IM3\_A} \leq (k_1 + 1)f_S,$$

and $$\left(k_2 + \frac{1}{2}\right)f_S \leq f_{C2} - \frac{1}{2}bw_{IM3\_B} \leq f_{C2} + \frac{1}{2}bw_{IM3\_B} \leq \left(k_2 + \frac{3}{4}\right)f_S.$$

Constraint 2.6: An image of the second original frequency band 28 fully falls within the frequency range of 0 to $f_S/4$ and a frequency-flipped image of the first original frequency band 26 fully falls within the frequency range of $f_S/4$ to $f_S/2$. Constraint 2.6 can be expressed as:

$$\left(k_1 + \frac{3}{4}\right)f_S \leq f_{C2} - \frac{1}{2}bw_{IM3\_B} \leq f_{C2} + \frac{1}{2}bw_{IM3\_B} \leq (k_1 + 1)f_S,$$

and

-continued $$\left(k_2 + \frac{1}{4}\right)f_S \leq f_{C1} - \frac{1}{2}bw_{IM3\_A} \leq f_{C1} + \frac{1}{2}bw_{IM3\_A} \leq \left(k_2 + \frac{1}{2}\right)f_S.$$

Constraint 2.7: A frequency-flipped image of the second original frequency band 28 fully falls within the frequency range of 0 to $f_S/4$ and an image of the first original frequency band 26 fully falls within the frequency range of $f_S/4$ to $f_S/2$. Constraint 2.7 can be expressed as:

$$\left(k_1 + \frac{3}{4}\right)f_S \leq f_{C2} - \frac{1}{2}bw_{IM3\_B} \leq f_{C2} + \frac{1}{2}bw_{IM3\_B} \leq \left(k_1 + \frac{1}{4}\right)f_S,$$

and $$\left(k_2 + \frac{1}{2}\right)f_S \leq f_{C1} - \frac{1}{2}bw_{IM3\_A} \leq f_{C1} + \frac{1}{2}bw_{IM3\_A} \leq \left(k_2 + \frac{3}{4}\right)f_S.$$

Constraint 2.8: A frequency-flipped image of the second original frequency band 28 fully falls within the frequency range of 0 to $f_S/4$ and a frequency-flipped image of the first original frequency band 26 fully falls within the frequency range of $f_S/4$ to $f_S/2$. Constraint 2.8 can be expressed as:

$$\left(k_1 + \frac{3}{4}\right)f_S \leq f_{C2} - \frac{1}{2}bw_{IM3\_B} \leq f_{C2} + \frac{1}{2}bw_{IM3\_B} \leq (k_1 + 1)f_S,$$

and $$\left(k_2 + \frac{1}{4}\right)f_S \leq f_{C1} - \frac{1}{2}bw_{IM3\_A} \leq f_{C1} + \frac{1}{2}bw_{IM3\_A} \leq \left(k_2 + \frac{1}{2}\right)f_S.$$

The following table illustrates the images or frequency-flipped images in each of frequency ranges 0 to $f_S/4$ and $f_S/4$ to $f_S/2$ (i.e., frequency zones 0 and 1 in the first Nyquist zone). In Table 1, the signal in the first original frequency band 26 is denoted as $S_A$ and the signal in the second original frequency band 28 is denoted as $S_B$.

TABLE 1

|  | Frequency Range 0 to $f_S/4$ (Zone 0) | Frequency Range $f_S/4$ to $f_S/2$ (Zone 1) |
| --- | --- | --- |
| Constraint 2.1 | Image of $S_A$ | Image of $S_B$ |
| Constraint 2.2 | Image of $S_B$ | Image of $S_A$ |
| Constraint 2.3 | Frequency-Flipped Image of $S_A$ | Image of $S_B$ |
| Constraint 2.4 | Image of $S_A$ | Frequency-Flipped Image of $S_B$ |
| Constraint 2.5 | Frequency-Flipped Image of $S_A$ | Frequency-Flipped Image of $S_B$ |
| Constraint 2.6 | Image of $S_B$ | Frequency-Flipped Image of $S_A$ |
| Constraint 2.7 | Frequency-Flipped Image of $S_B$ | Image of $S_A$ |
| Constraint 2.8 | Frequency-Flipped Image of $S_B$ | Frequency-Flipped Image of $S_A$ |

Figure 3:
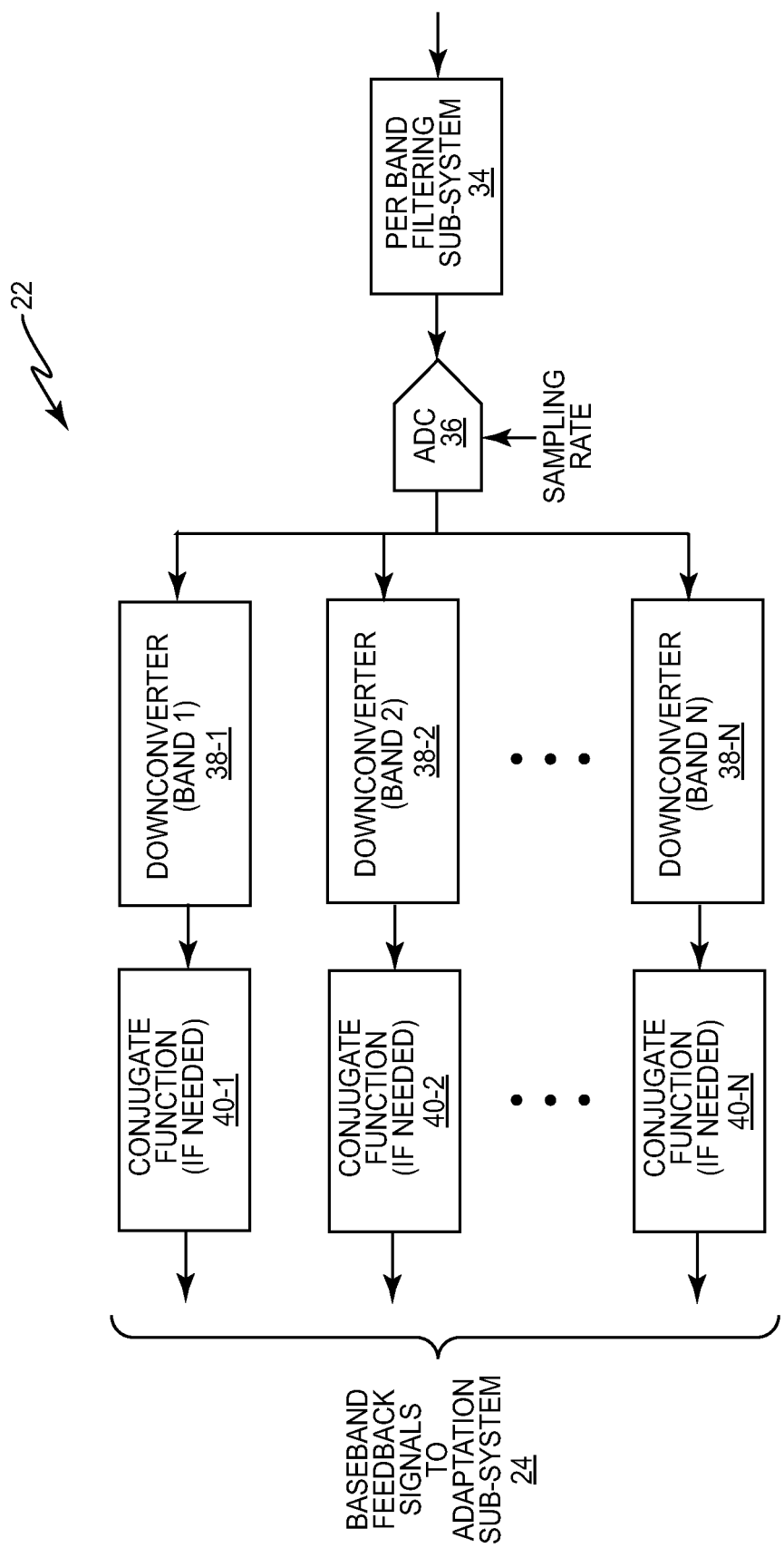
FIG. 3 is a block diagram of the undersampling receiver of FIG. 1 according to one embodiment of the present disclosure.

FIG. 3 illustrates one embodiment of the undersampling observation receiver 22. In this embodiment, the undersampling observation receiver 22 includes a per band filtering sub-system 34, an analog-to-digital converter (ADC) 36, a number (N) of downconverters 38-1 through 38-N, and a number (N) of conjugate functions 40-1 through 40-N connected as shown. The per band filtering sub-system 34 preferably includes a number of analog filters that operate to filter the concurrent multi-band signal to attenuate frequency components other than those in the original frequency bands of the concurrent multi-band signal. The filtered, concurrent multi-band signal is then undersampled by the ADC 36 at a sampling rate selected such that images or frequency-flipped images of all of the original frequency bands of the concurrent multi-band signal fall within a frequency range of zero to half of the sampling rate and do not overlap one another. Therefore, for each original frequency band, either an image or a frequency-flipped image of the original frequency band falls within the frequency range of zero to half of the sampling rate and does not overlap with the image or frequency-flipped image of any of the other original frequency bands falling within the frequency range of zero to half of the sampling rate.

The output of the ADC 36, which is referred to as an undersampled concurrent multi-band signal, is then provided to the downconverters 38-1 through 38-N. Each of the downconverters 38-1 through 38-N performs downconversion for a different one of the original frequency bands of the concurrent multi-band signal. Specifically, each of the downconverters 38-1 through 38-N operates to downconvert the image or frequency-flipped image of the corresponding original frequency band that falls within the frequency range of zero to half of the sampling rate to baseband. Notably, tuning frequencies of the downconverters 38-1 through 38-N are set according to center frequencies of the image or frequency-flipped image of the corresponding original frequency band that falls within the frequency range of zero to half of the sampling rate. The output signals of the downconverters 38-1 through 38-N are referred to herein as image baseband signals or frequency-flipped image baseband signals depending on whether the output signals are baseband representations of an image or frequency-flipped image of the corresponding original frequency bands of the concurrent multi-band signal, respectively.

Lastly, the conjugate functions 40-1 through 40-N generally operate to compute the complex conjugate of any frequency-flipped image baseband signals output by the downconverters 38-1 through 38-N. By taking the complex conjugate, the frequency-flipped image baseband signals are converted to image baseband signals that represent images of the corresponding original frequency bands of the concurrent multi-band signal. Using the conjugate function 40-1 as an example, the conjugate function 40-1 outputs a complex conjugate of the output signal from the downconverter 38-1 if the output signal from the downconverter 38-1 represents a frequency-flipped image of the corresponding original frequency band. Otherwise, the conjugate function 40-1 outputs the image baseband signal received from the downconverter 38-1. The image baseband signals are provided as baseband feedback signals to the adaptation sub-system 24, where each of the baseband feedback signals is for a different one of the original frequency bands of the concurrent multi-band signal. The baseband feedback signals are also referred to herein as the undersampled feedback signals for the original frequency bands of the concurrent multi-band signal.

Figure 4A:
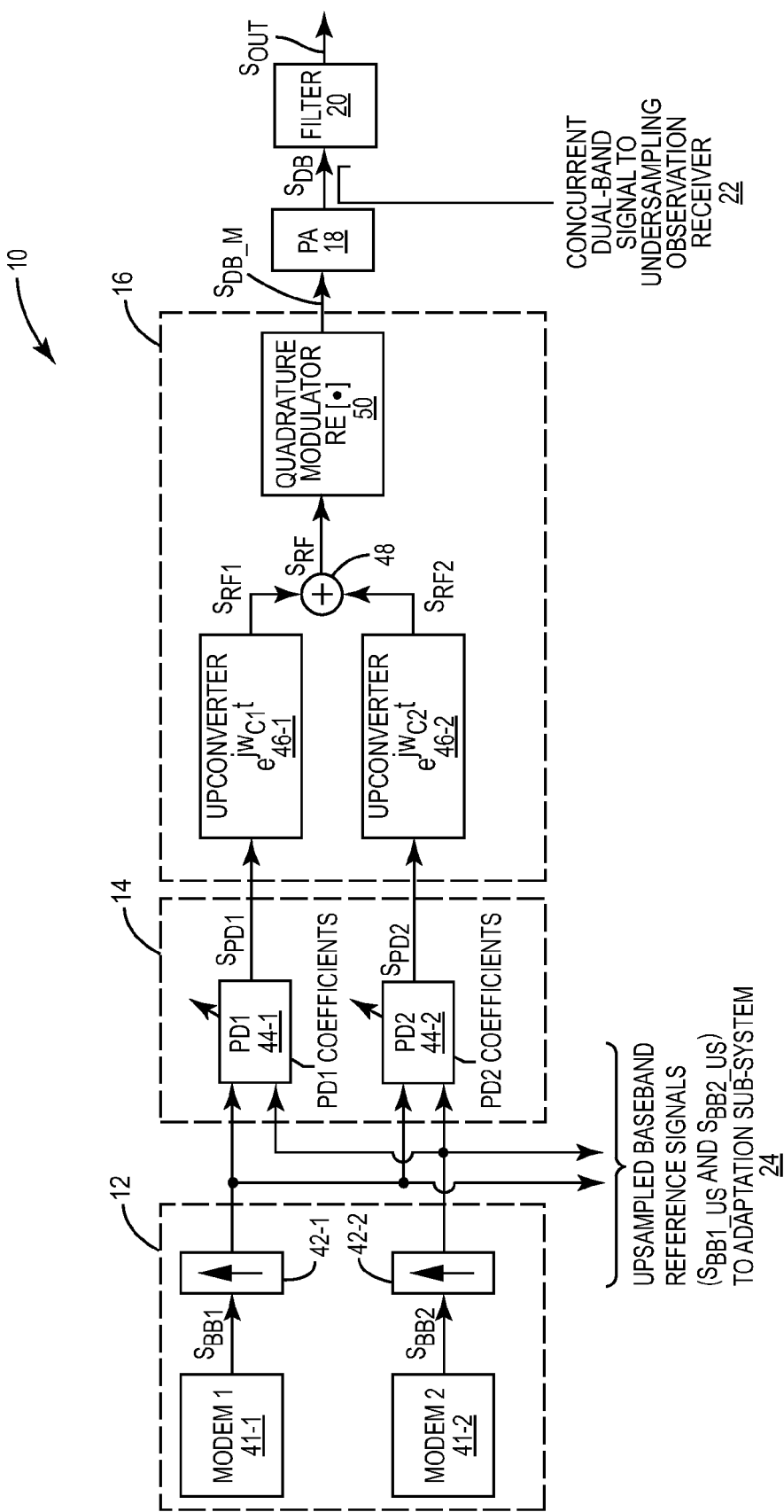
FIGS. 4A and 4B are block diagrams of a transmit path and a feedback path of a dual-band transmitter having separate predistortion for each original frequency band where the feedback path includes an undersampling observation receiver according to one embodiment of the present disclosure.
Figure 4B:
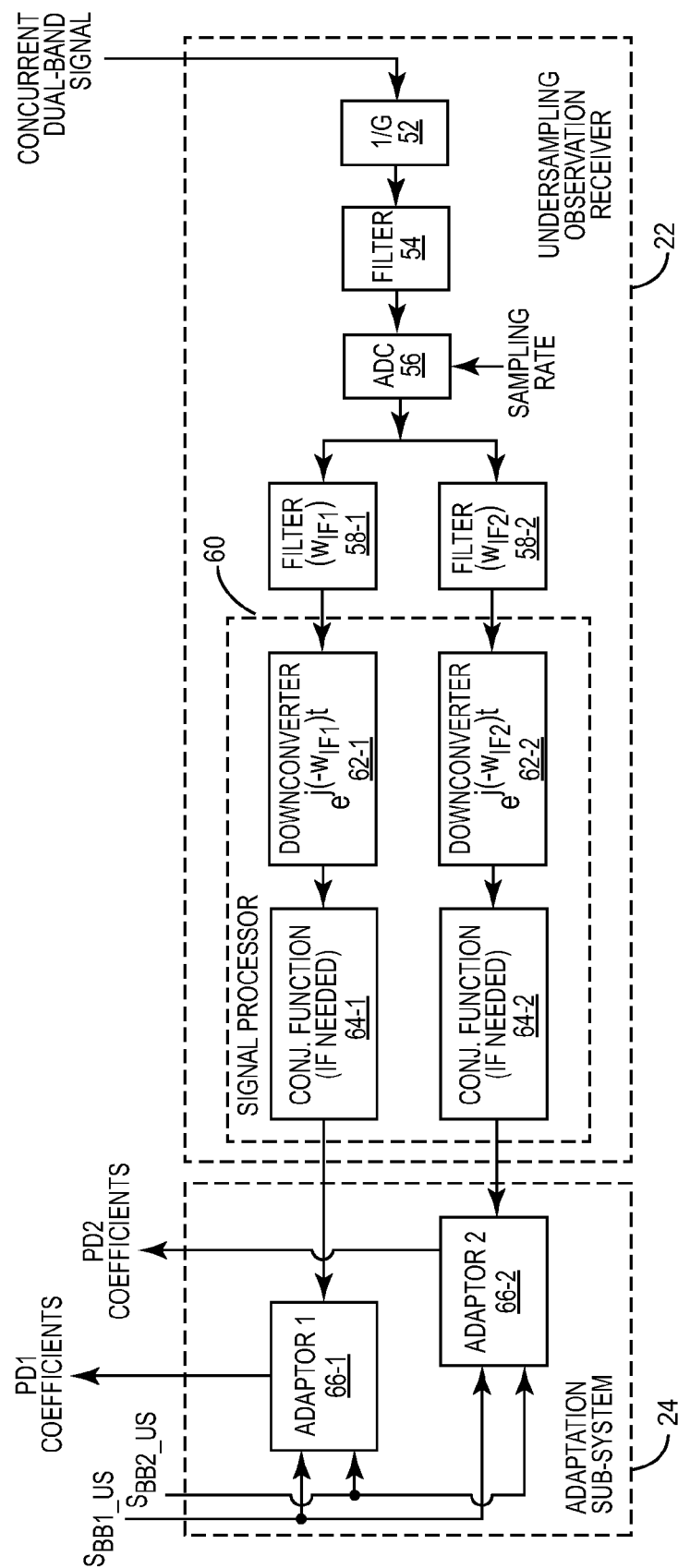

FIGS. 4A and 4B are block diagrams of a transmit path and a feedback path of the transmitter 10 wherein the transmitter 10 provides separate predistortion for each original frequency band of the concurrent multi-band signal according to one embodiment of the present disclosure. In this embodiment, the concurrent multi-band signal is a concurrent dual-band signal. More specifically, FIG. 4A illustrates the transmit path of the transmitter 10 according to this embodiment. As shown, the baseband signal source 12 includes first and second modems 41-1 and 41-2 and first and second upsampling circuits 42-1 and 42-2 connected as shown. The first modem 41-1 outputs a first baseband signal ($S_{BB1}$) for a first original frequency band of the concurrent dual-band signal. The first baseband signal ($S_{BB1}$) is upsampled to a desired sampling rate for predistortion by the first upsampling circuit 42-1 to output a first upsampled baseband signal ($S_{BB1\_US}$). Similarly, the second modem 41-2 outputs a second baseband signal ($S_{BB2}$) for a second original frequency band of the concurrent dual-band signal. The second baseband signal ($S_{BB2}$) is upsampled to a desired sampling rate for predistortion by the second upsampling circuit 42-2 to output a second upsampled baseband signal ($S_{BB2\_US}$).

The predistortion sub-system 14 includes a first predistorter (PD1) 44-1 and a second predistorter (PD2) 44-2. The first predistorter 44-1 receives the first and second upsampled baseband signals ($S_{BB1\_US}$ and $S_{BB2\_US}$) and outputs a predistorted baseband signal for the first original frequency band of the concurrent dual-band signal ($S_{PD1}$). Likewise, the second predistorter 44-2 receives the first and second upsampled baseband signals ($S_{BB1\_US}$ and $S_{BB2\_US}$) and outputs a predistorted baseband signal for the second original frequency band of the concurrent dual-band signal ($S_{PD2}$). Notably, the predistortion applied by the first and second predistorters 44-1 and 44-2 is controlled by corresponding predistortion coefficients (PD1 coefficients and PD2 coefficients) provided by the adaptation sub-system 24.

The modulation and upconversion sub-system 16 includes upconverters 46-1 and 46-2, a combiner 48, and a quadrature modulator 50 connected as shown. The upconverter 46-1 upconverts the predistorted baseband signal for the first original frequency band ($S_{PD1}$) to the desired carrier frequency ($\omega_{C1}=2\pi f_{C1}$) for the first original frequency band of the concurrent dual-band signal to provide a first radio frequency signal ($S_{RF1}$). The upconverter 46-2 upconverts the predistorted baseband signal for the second original frequency band ($S_{PD2}$) to the desired carrier frequency ($\chi_{C2}=2\pi f_{C2}$) for the second original frequency band of the concurrent dual-band signal to provide a second radio frequency signal ($S_{RF2}$). The combiner 48 then combines the first and second radio frequency signals ($S_{RF1}$ and $S_{RF2}$) to provide a combined radio frequency signal ($S_{RF}$), which is a concurrent dual-band signal. The quadrature modulator 50 then modulates the combined radio frequency signal ($S_{RF}$) to provide a modulated concurrent dual-band signal ($S_{DB\_M}$). The modulated concurrent dual-band signal ($S_{DB\_M}$) is amplified by the power amplifier 18 to provide a concurrent dual-band signal ($S_{DB}$), which is then filtered by the filter 20 to provide a filtered concurrent dual-band signal ($S_{OUT}$).

FIG. 4B illustrates the feedback path of the transmitter 10 according to this embodiment. As shown, the undersampling observation receiver 22 includes an attenuator 52 that attenuates a concurrent dual-band signal by a factor of 1/G, where G is a gain of the power amplifier 18. Note that the concurrent dual-band signal is preferably obtained from the output of the power amplifier 18 via a coupler. The attenuated dual-band signal is then filtered by a filter 54, and then undersampled by an ADC 56 at a desired sampling rate. Again, the sampling rate for undersampling by the ADC 56 is selected such that images or frequency-flipped images of all of the original frequency bands of the concurrent dual-band signal ($S_{DB}$) fall within a frequency range of zero to half of the sampling rate and do not overlap one another. The undersampled dual-band signal is then provided to filters 58-1 and 58-2. The filter 58-1 attenuates or removes frequency components other than those in either the image or frequency-flipped image of the first original frequency band. Similarly, the filter 58-2 attenuates or removes frequency components other than those in either the image or frequency-flipped image of the second original frequency band.

The undersampling observation receiver 22 also includes a signal processor 60 that generally operates to downconvert the output signals from the filters 58-1 and 58-2 and, if needed, provides the complex conjugates of the resulting downconverted signals to provide baseband feedback signals for the original frequency bands of the concurrent dual-band signal ($S_{DB}$). More specifically, the signal processor 60 includes downconverters 62-1 and 62-2 and conjugate functions 64-1 and 64-2 arranged as shown. Each of the downconverters 62-1 and 62-2 performs downconversion for a different one of the original frequency bands of the concurrent dual-band signal ($S_{DB}$). Specifically, each of the downconverters 62-1 and 62-2 operates to downconvert the image or frequency-flipped image of the corresponding original frequency band that falls within the frequency range of zero to half of the sampling rate to baseband. Notably, tuning frequencies of the downconverters 62-1 and 62-2 are set according to center frequencies of the image or frequency-flipped image of the corresponding original frequency band that falls within the frequency range of zero to half of the sampling rate. The output signals of the downconverters 62-1 and 62-2 are referred to herein as image baseband signals or frequency-flipped image baseband signals depending on whether the output signals are baseband representations of an image or frequency-flipped image of the corresponding original frequency bands of the concurrent dual-band signal ($S_{DB}$), respectively.

The conjugate functions 64-1 and 64-2 generally operate to compute the complex conjugate of any frequency-flipped baseband signals output by the downconverters 62-1 and 62-2. By taking the complex conjugate, the frequency-flipped image baseband signals are converted to image baseband signals that represent images of the corresponding original frequency bands of the concurrent dual-band signal ($S_{DB}$). Using the conjugate function 64-1 as an example, the conjugate function 64-1 outputs a complex conjugate of the output signal from the downconverter 62-1 if the output signal from the downconverter 62-1 represents a frequency-flipped image of the corresponding original frequency band. Otherwise, the conjugate function 64-1 outputs the image baseband signal received from the downconverter 62-1. The image baseband signals are provided as baseband feedback signals to the adaptation sub-system 24, where each of the baseband feedback signals is for a different one of the original frequency bands of the concurrent dual-band signal ($S_{DB}$). The image baseband signals are also referred to herein as undersampled feedback signals for the original frequency bands of the concurrent dual-band signal ($S_{DB}$).

Lastly, the adaptation sub-system 24 includes separate adaptors 66-1 and 66-2 for the original frequency bands of the concurrent dual-band signal ($S_{DB}$). As shown, the adaptor 66-1 adaptively configures the predistorter 44-1 for the first original frequency band of the concurrent dual-band signal ($S_{DB}$) based on the image baseband feedback signal (i.e., the undersampled feedback signal) for the first original frequency band from the undersampling observation receiver 22 and the upsampled baseband signals ($S_{BB1\_US}$ and $S_{BB2\_US}$) from the baseband signal source 12 using any suitable adaptation technique. Likewise, the adaptor 66-2 adaptively configures the predistorter 44-2 for the second original frequency band of the concurrent dual-band signal ($S_{DB}$) based on the baseband feedback signal (i.e., the undersampled feedback signal) for the second original frequency band from the undersampling observation receiver 22 and the upsampled baseband signals ($S_{BB1\_US}$ and $S_{BB2\_US}$) from the baseband signal source 12 using any suitable adaptation technique.

Before proceeding, it should be noted that the architecture of FIGS. 4A and 4B can be extended to any multi-band signal. Specifically, for a multi-band signal having three or more original frequency bands, the transmitter 10 of FIGS. 4A and 4B may be modified to include additional modems and upsampling circuits in the baseband signal source 12, additional predistorters in the predistortion sub-system 14, additional upconverters in the modulation and upconversion sub-system 16, additional filters in the undersampling observation receiver 22, additional downconverters and conjugate functions in the signal processor 60, and additional adaptors in the adaptation sub-system 24.

Figure 5A:
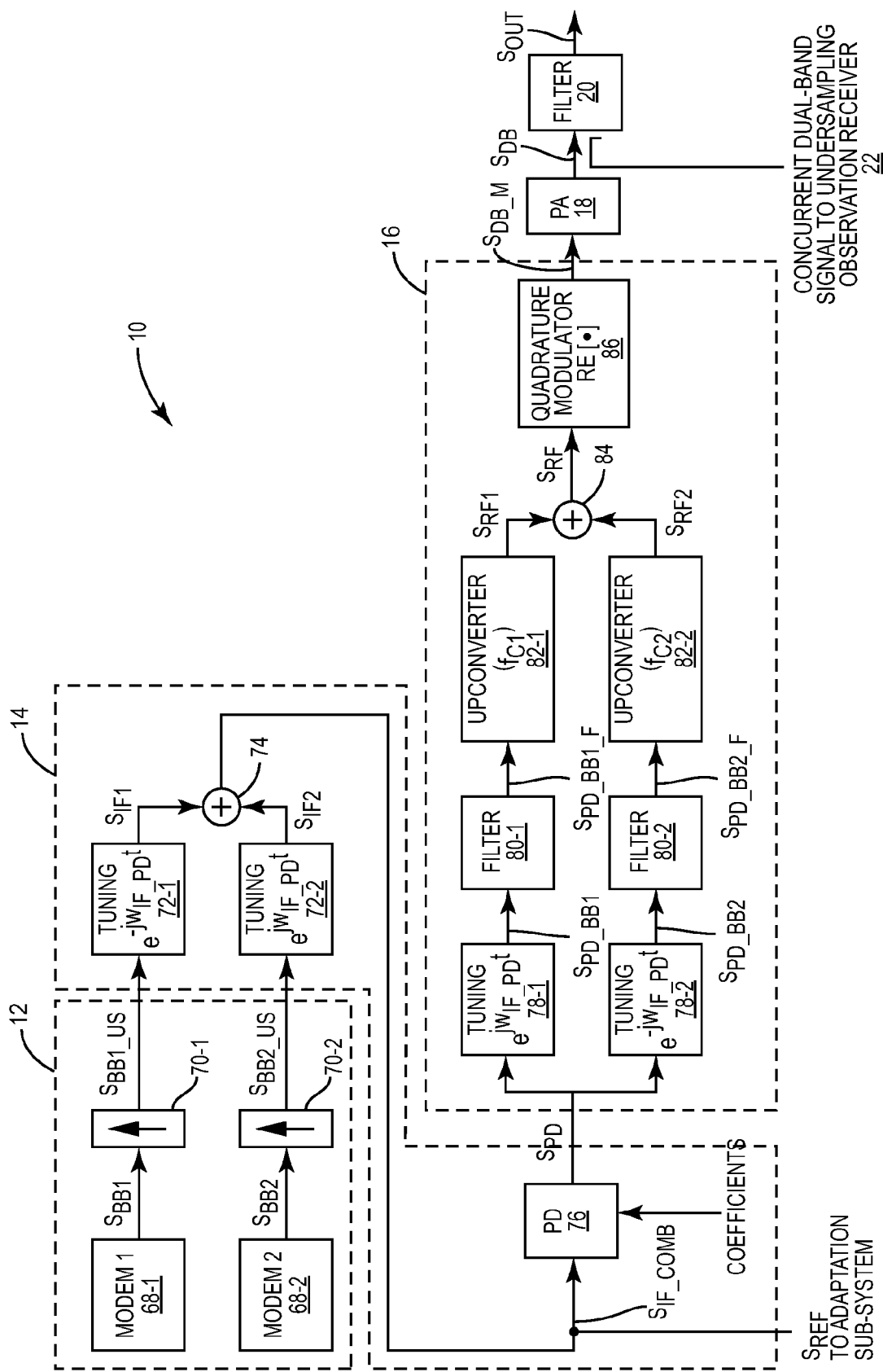
FIGS. 5A and 5B are block diagrams of a transmit path and a feedback path of a dual-band transmitter having a combined predistorter for all original frequency bands where the feedback path includes an undersampling observation receiver according to one embodiment of the present disclosure.
Figure 5B:
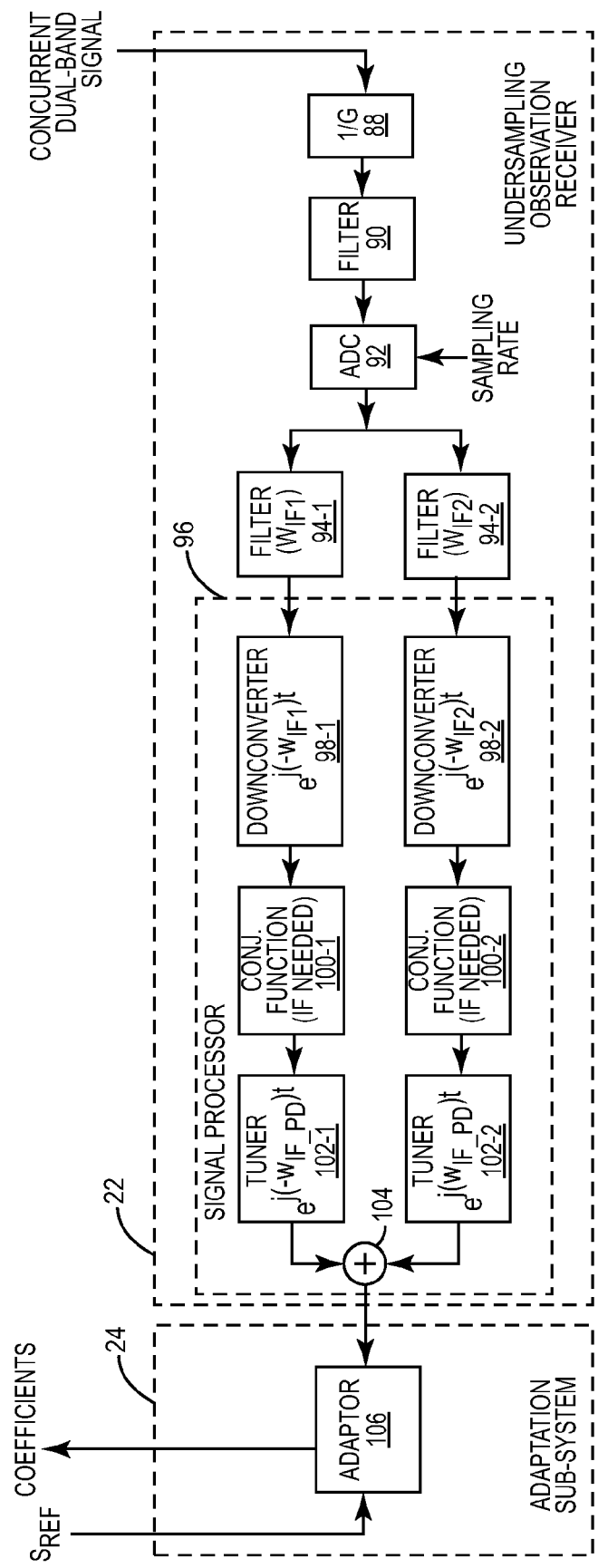

FIGS. 5A and 5B are block diagrams of a transmit path and a feedback path of the transmitter 10 wherein the transmitter 10 provides combined predistortion for all of the original frequency bands of the concurrent multi-band signal according to another embodiment of the present disclosure. In this embodiment, the concurrent multi-band signal is a concurrent dual-band signal. More specifically, FIG. 5A illustrates the transmit path for this embodiment. As shown, the baseband signal source 12 includes first and second modems 68-1 and 68-2 and first and second upsampling circuits 70-1 and 70-2 connected as shown. The first modem 68-1 outputs a first baseband signal ($S_{BB1}$) for a first original frequency band of the concurrent dual-band signal. The first baseband signal ($S_{BB1}$) is upsampled to a desired sampling rate for predistortion by the first upsampling circuit 70-1 to output a first upsampled baseband signal ($S_{BB1\_US}$). Similarly, the second modem 68-2 outputs a second baseband signal ($S_{BB2}$) for a second original frequency band of the concurrent dual-band signal. The second baseband signal ($S_{BB2}$) is upsampled to a desired sampling rate for predistortion by the second upsampling circuit 70-2 to output a second upsampled baseband signal ($S_{BB2\_US}$).

Tuning circuitry 72-1 tunes the first upsampled baseband signal ($S_{BB1\_US}$) to a first intermediate frequency to provide a first intermediate frequency signal ($S_{IF1}$). In a similar manner, tuning circuitry 72-2 tunes the second upsampled baseband signal ($S_{BB2\_US}$) to a second intermediate frequency to provide a second intermediate frequency signal ($S_{IF2}$). In this embodiment, the first and second intermediate frequencies are $-f_{PD\_IF}$ and $f_{PD\_IF}$, respectively. In other words, the first intermediate frequency is a negative frequency, the second intermediate frequency is a positive frequency, and an absolute value of both the first and second intermediate frequencies is equal to $f_{PD\_IF}$. This is referred to herein as a symmetrical intermediate frequency embodiment. However, the transmitter 10 is not limited to the use of symmetrical intermediate frequencies. In another embodiment, asymmetrical intermediate frequencies may be used.

The first and second intermediate frequency signals ($S_{IF1}$ and $S_{IF2}$) are combined, or summed, by a combiner 74 to provide a combined intermediate frequency signal ($S_{IF\_COMB}$). The combined intermediate frequency signal ($S_{IF\_COMB}$) is a dual-band signal having a first frequency band centered at the first intermediate frequency, a second frequency band centered at the second intermediate frequency, and no frequency components between the first and second frequency bands. Also, it should be noted that the combined intermediate frequency signal ($S_{IF\_COMB}$) is an equivalent baseband signal and is also a complex signal. A predistorter (PD) 76 then predistorts the combined intermediate frequency signal ($S_{IF\_COMB}$) to provide a predistorted signal ($S_{PD}$). More specifically, the predistorter 76 applies a predefined predistortion to the combined intermediate frequency signal ($S_{IF\_COMB}$) that compensates for non-linearity of the power amplifier 18 in the transmit path. It should be noted that the predistorter 76 simultaneously, or concurrently, performs predistortion for both of the first and second baseband signals ($S_{BB1}$ and $S_{BB2}$) and is therefore referred to herein as a dual-band predistorter. However, because the input of the predistorter 76 is a single input (i.e., a single dual-band signal input), the predistorter 76 may use any predistortion technique designed for a single band input (e.g., polynomial predistortion, predistortion using a neural network, or the like).

The predistorted signal ($S_{PD}$) is then provided to tuning circuitry 78-1 that operates to tune the frequency band in the predistorted signal ($S_{PD}$) that is centered at the first intermediate frequency, which in this embodiment is $f_{IF\_PD}$, from the first intermediate frequency to baseband to thereby provide a first predistorted baseband signal ($Sp_{PD\_BB1}$). The first predistorted baseband signal ($S_{PD\_BB1}$) is then low-pass filtered by a filter 80-1 to remove unwanted frequency components (i.e., those frequency components that are outside of the frequency band centered at Direct Current (DC)), thereby providing a first filtered predistorted baseband signal ($S_{PD\_BB1\_F}$). An upconverter 82-1 then upconverts the first filtered predistorted baseband signal ($S_{PD\_BB1\_F}$) from baseband to a first carrier frequency ($f_{C1}$) for the first original frequency band of the concurrent dual-band signal to thereby provide a first radio frequency signal ($S_{RF1}$). Notably, all of the processing up to the upconverter 82-1 is in the digital domain. As such, the upconverter 82-1 preferably also performs digital-to-analog conversion either at baseband or radio frequency, depending on the particular implementation.

In a similar manner, the predistorted signal ($S_{PD}$) is also provided to tuning circuitry 78-2 that operates to tune the frequency band in the predistorted signal ($S_{PD}$) that is centered at the second intermediate frequency, which in this embodiment is $-f_{IF\_PD}$, from the second intermediate frequency to baseband to thereby provide a second predistorted baseband signal ($S_{PDBB2}$). The second predistorted baseband signal ($S_{PD\_BB2}$) is then low-pass filtered by a filter 80-2 to remove unwanted frequency components (i.e., those frequency components that are outside of the frequency band centered at DC), thereby providing a second filtered predistorted baseband signal ($S_{PD\_BB2}$). An upconverter 82-2 then upconverts the second filtered predistorted baseband signal ($S_{PD\_BB2\_F}$) from baseband to a second carrier frequency ($f_{C2}$) of the second original frequency band of the concurrent dual-band signal to thereby provide a second radio frequency signal ($S_{RF2}$). Notably, all of the processing up to the upconverter 82-2 is in the digital domain. As such, the upconverter 82-2 preferably also performs digital-to-analog conversion either at baseband or radio frequency, depending on the particular implementation.

A combiner 84 then combines, or sums, the first and second radio frequency signals ($S_{RF1}$ and $S_{RF2}$) to provide a combined radio frequency signal ($S_{RF}$). The combined radio frequency signal ($S_{RF}$) is a concurrent dual-band signal having a first frequency band centered at the first carrier frequency ($f_{C1}$), a second frequency band centered at the second carrier frequency ($f_{C2}$), and no frequency components between the first and second frequency bands. In addition, the combined radio frequency signal ($S_{RF}$) is a predistorted signal. A quadrature modulator 86 then modulates the combined radio frequency signal ($S_{RF}$) to provide a modulated concurrent dual-band signal ($S_{DB\_M}$). The power amplifier 18 then amplifies the modulated concurrent dual-band signal ($S_{DB\_M}$) to a desired output power level, thereby providing an amplified concurrent dual-band signal, which is referred to herein as the concurrent dual-band signal ($S_{DB}$) to be transmitted by the transmitter 10. Lastly, the filter 20 removes out-of-band frequency components from the concurrent dual-band signal ($S_{DB}$) to provide an output signal ($S_{OUT}$) of the transmitter 10. Specifically, the filter 20 removes any residual out-of-band distortion.

In one embodiment, a separation between the first and second intermediate frequencies is carefully selected to be at or near a minimum separation value below which frequency bands in the predistorted signal ($S_{PD}$) for third-order and, in some embodiments, higher-order intermodulation distortion do not overlap frequency bands in the predistorted signal ($S_{PD}$) centered at the first and second intermediate frequencies. By doing so, the frequency bands remain separable while at the same time the sampling rate for predistortion ($f_{S\_PD}$) can be reduced. In addition to minimizing the separation between the first and second intermediate frequencies, a sampling rate for predistortion ($f_{S\_PD}$) may also be minimized by setting the sampling rate for predistortion ($f_{S\_PD}$) equal to or near a minimum value below which frequency bands in the predistorted signal ($S_{PD}$) for third-order or, in some embodiments, higher-order intermodulation distortion alias into the frequency bands in the predistorted signal ($S_{PD}$) centered at the first and second intermediate frequencies. Notably, while in the preferred embodiment both the separation between the first and second intermediate frequencies and the sampling rate for predistortion ($f_{S\_PD}$) are minimized, the separation between the first and second intermediate frequencies may be minimized without minimizing the sampling rate for predistortion ($f_{S\_PD}$), and the sampling rate for predistortion ($f_{S\_PD}$) may be minimized without minimizing the separation between the first and second intermediate frequencies.

FIG. 5B illustrates the feedback path for this embodiment. As shown, the undersampling observation receiver 22 includes an attenuator 88 that attenuates the concurrent dual-band signal ($S_{DB}$) by a factor of 1/G, where G is a gain of the power amplifier 18. The attenuated dual-band signal is then filtered by a filter 90, and then undersampled by an ADC 92 at a desired sampling rate. Again, the sampling rate for undersampling by the ADC 92 is selected such that images or frequency-flipped images of all of the original frequency bands of the concurrent dual-band signal ($S_{DB}$) fall within a frequency range of zero to half of the sampling rate and do not overlap one another. The undersampled dual-band signal is then provided to filters 94-1 and 94-2. The filter 94-1 attenuates or removes frequency components other than those in either the image or frequency-flipped image of the first original frequency band. Similarly, the filter 94-2 attenuates or removes frequency components other than those in either the image or frequency-flipped image of the second original frequency band.

The undersampling observation receiver 22 also includes a signal processor 96 that generally operates to downconvert the output signals from the filters 94-1 and 94-2 and, if needed, provide the complex conjugates of the resulting downconverted signals to ultimately provide a combined baseband feedback signal for the concurrent dual-band signal ($S_{DB}$). More specifically, the signal processor 96 includes downconverters 98-1 and 98-2, conjugate functions 100-1 and 100-2, tuners 102-1 and 102-2, and a combiner 104 arranged as shown. Each of the downconverters 98-1 and 98-2 performs downconversion for a different one of the original frequency bands of the concurrent dual-band signal ($S_{DB}$). Specifically, each of the downconverters 98-1 and 98-2 operates to downconvert the image or frequency-flipped image of the corresponding original frequency band that falls within the frequency range of zero to half of the sampling rate to baseband. Notably, tuning frequencies of the downconverters 98-1 and 98-2 are set according to center frequencies of the image or frequency-flipped image of the corresponding original frequency band that falls within the frequency range of zero to half of the sampling rate. The output signals of the downconverters 98-1 and 98-2 are referred to herein as image baseband signals or frequency-flipped image baseband signals depending on whether the output signals are baseband representations of an image or frequency-flipped image of the corresponding original frequency bands of the concurrent dual-band signal ($S_{DB}$), respectively.

The conjugate functions 100-1 and 100-2 generally operate to compute the complex conjugate of any frequency-flipped baseband signals output by the downconverters 98-1 and 98-2. By taking the complex conjugate, the frequency-flipped image baseband signals are converted to image baseband signals that represent images of the corresponding original frequency bands of the concurrent dual-band signal ($S_{DB}$). Using the conjugate function 100-1 as an example, the conjugate function 100-1 outputs a complex conjugate of the output signal from the downconverter 98-1 if the output signal from the downconverter 98-1 represents a frequency-flipped image of the corresponding original frequency band. Otherwise, the conjugate function 100-1 outputs the image baseband signal received from the downconverter 98-1. The tuners 102-1 and 102-2 tune the outputs of the conjugate functions 100-1 and 100-2 to the appropriate intermediate frequencies $f_{IF\_PD}$ and $-f_{IF\_PD}$, respectively. The outputs of the tuners 102-1 and 102-2 are then combined by the combiner 104 to provide a combined intermediate frequency feedback signal. Lastly, the adaptation sub-system 24 includes an adaptor 106 that adaptively configures the predistorter 76 based on the combined intermediate frequency feedback signal from the undersampling observation receiver 22 and the combined intermediate frequency signal ($S_{IF\_COMB}$) from the combiner 74 in the transmit path using any suitable adaptation technique.

Figure 6:
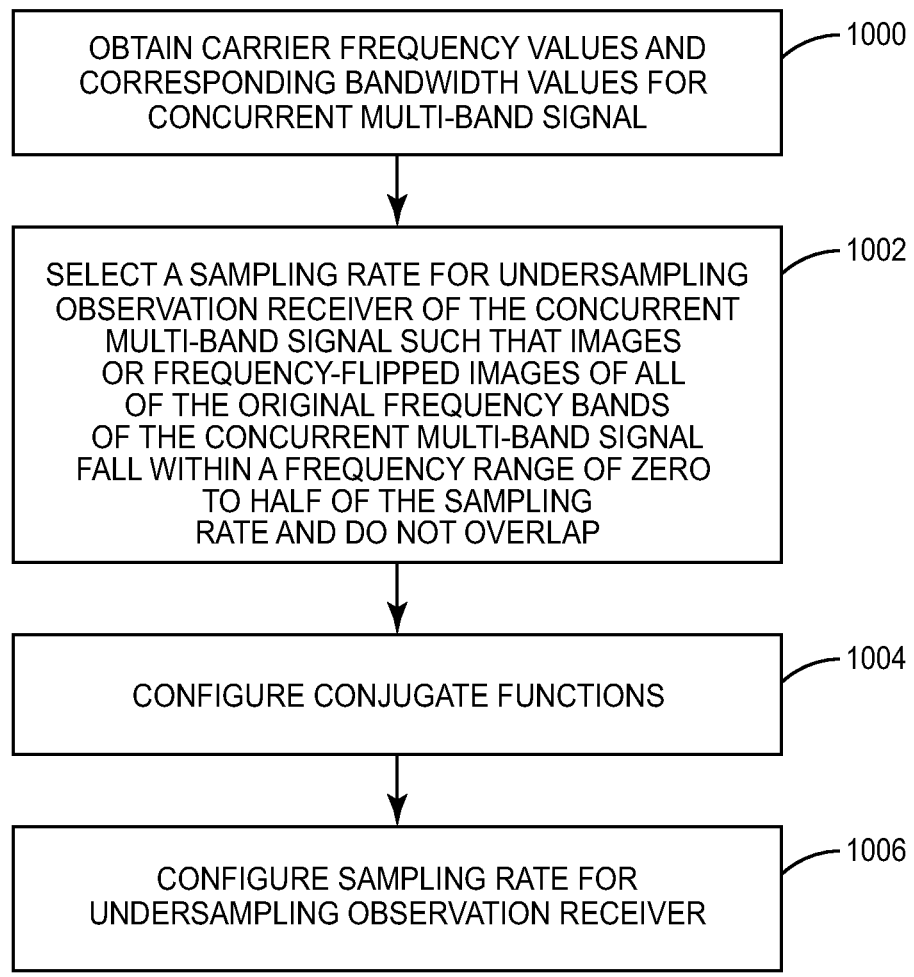
FIG. 6 illustrates a process for selecting a sampling rate for an undersampling observation receiver such that either an image or a frequency-flipped image of all original frequency bands of a concurrent multi-band signal fall within a frequency range of zero to half of the sampling rate according to one embodiment of the present disclosure.

FIG. 6 illustrates a process for selecting a sampling rate for the undersampling observation receiver 22 such that either an image or a frequency-flipped image of all original frequency bands of a concurrent multi-band signal fall within a frequency range of zero to half of the sampling rate according to one embodiment of the present disclosure. First, carrier frequency values and corresponding bandwidth values are obtained for all original frequency bands of the concurrent multi-band signal (step 1000). Based on the carrier frequency values and the bandwidth values for the concurrent multi-band signal, a sampling rate for the undersampling observation receiver 22 is selected such that images or frequency-flipped images of all of the original frequency bands of the concurrent multi-band signal fall within a frequency range of zero to half of the sampling rate and do not overlap, or alias into, one another (step 1002). In one preferred embodiment, the sampling rate is selected such that a frequency-flipped image of at least one of the original frequency bands and images of any remaining original frequency bands of the concurrent multi-band signal fall within the frequency range of zero to half of the sampling rate and do not overlap, or alias into, one another.

The conjugate functions of the undersampling observation receiver 22 are then configured according to the selected sampling rate (step 1004). Specifically, based on the selected sampling rate, for each original frequency band, a determination is made as to whether an image or a frequency-flipped image of the original frequency band falls within the frequency range of zero to half of the sampling rate. If a frequency-flipped image of the original frequency band falls within the frequency range of zero to half of the sampling rate, then the corresponding conjugate function is configured to compute the complex conjugate of the frequency-flipped image to thereby provide an image of the corresponding original frequency band. Otherwise, the conjugate function is configured to output the image of the corresponding original frequency bands or may be bypassed. In addition, the sampling rate of the undersampling observation receiver 22 is configured as the selected sampling rate (step 1006).

Figure 7:
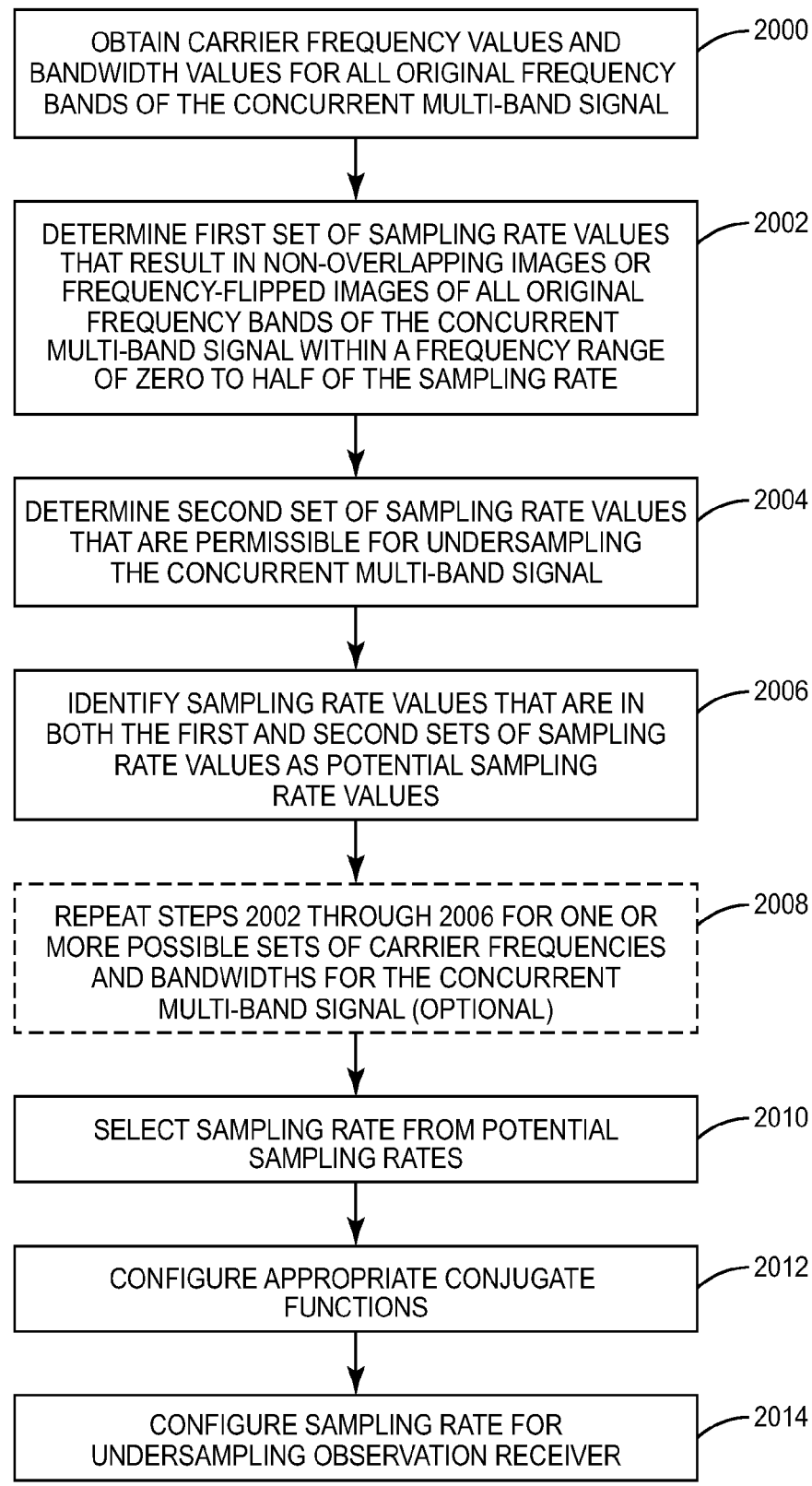
FIG. 7 illustrates a process for selecting a sampling rate for an undersampling observation receiver such that either an image or a frequency-flipped image of all original frequency bands of a concurrent multi-band signal fall within a frequency range of zero to half of the sampling rate according to another embodiment of the present disclosure.

FIG. 7 illustrates a process for selecting a sampling rate for the undersampling observation receiver 22 such that either an image or a frequency-flipped image of all original frequency bands of a concurrent multi-band signal fall within a frequency range of zero to half of the sampling rate according to another embodiment of the present disclosure. First, carrier frequency values and corresponding bandwidth values are obtained for all original frequency bands of the concurrent multi-band signal (step 2000). Based on the carrier frequency values and the bandwidth values for the concurrent multi-band signal, a first set of sampling rate values that result in either images or frequency-flipped images of all of the original frequency bands of the concurrent multi-band signal that fall within a frequency range of zero to the half of the sampling rate and do not overlap, or alias into, one another are determined (step 2002).

A second set of sampling rate values that are permissible for undersampling the concurrent multi-band signal are determined (step 2004). The second set of sampling rate values is a set of sampling rate values that satisfy known criteria required for undersampling. Sampling rate values that are both in the first set of sampling rate values and the second set of sampling rate values are identified as potential sampling rate values for the undersampling observation receiver 22 (step 2006). Optionally, if it is desired to select a sampling rate value that is suitable for different concurrent multi-band signals (i.e., concurrent multi-band signals having different or tunable carrier frequencies and/or frequency band bandwidths), steps 2000 through 2006 may be repeated for each different multi-band signal (step 2008). Alternatively, a desired sampling rate may be separately selected for each such different concurrent multi-band signal or groups thereof.

The sampling rate for the undersampling observation receiver 22 is then selected from the potential sampling rate values identified in step 2006 (step 2010). In one preferred embodiment, the sampling rate is selected such that a frequency-flipped image of at least one of the original frequency bands and images of any remaining original frequency bands of the concurrent multi-band signal fall within a frequency range of zero to half of the sampling rate and do not overlap, or alias into, one another.

The conjugate functions of the undersampling observation receiver 22 are then configured according to the selected sampling rate (step 2012). Specifically, based on the selected sampling rate, for each original frequency band, a determination is made as to whether an image or a frequency-flipped image of the original frequency band falls within the frequency range of zero to half of the sampling rate. If a frequency-flipped image of the original frequency band falls within the frequency range of zero to half of the sampling rate, then the corresponding conjugate function is configured to compute the complex conjugate of the frequency-flipped image to thereby provide an image of the corresponding original frequency band. In addition, the sampling rate of the undersampling observation receiver 22 is configured as the selected sampling rate (step 2014).

Figure 8:
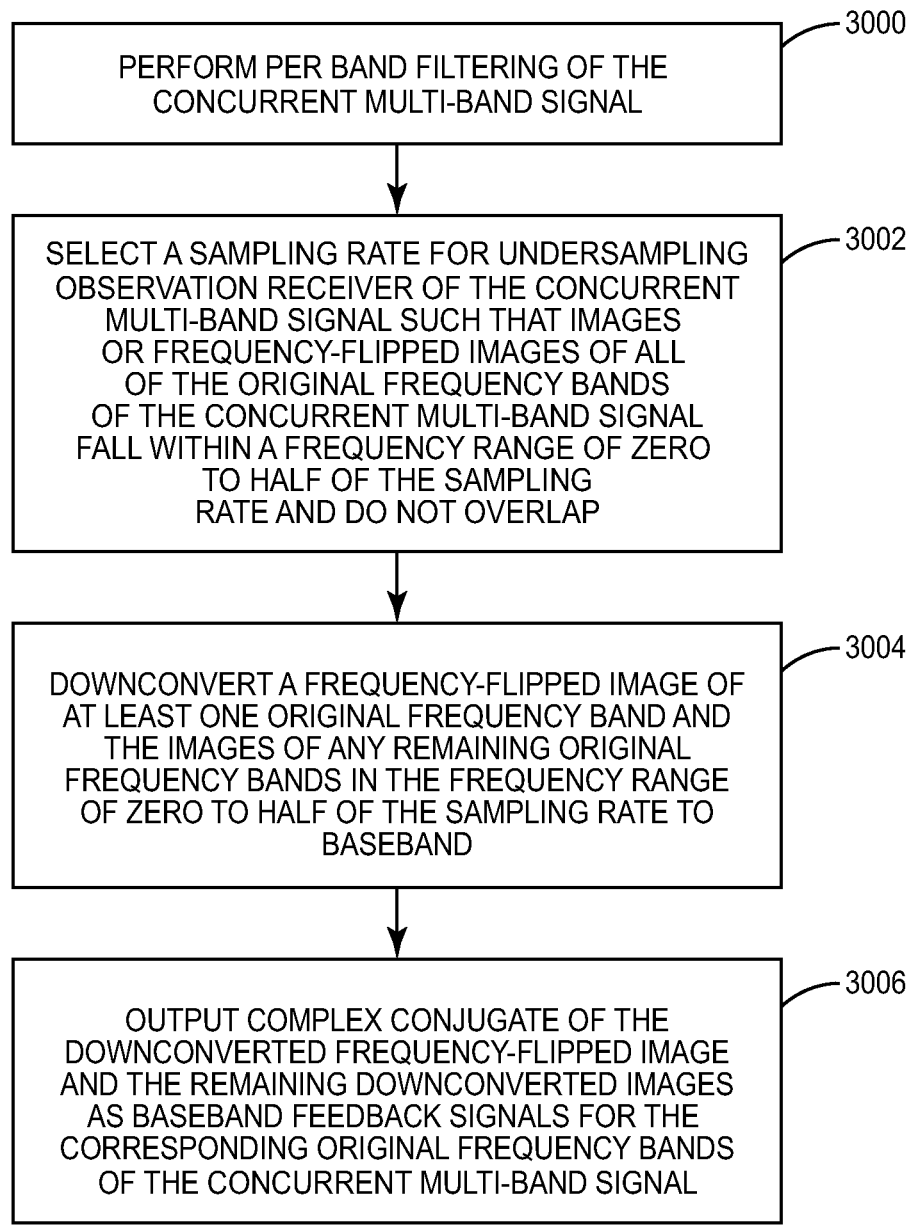
FIG. 8 illustrates the operation of an undersampling observation receiver according to one embodiment of the present disclosure.

FIG. 8 illustrates the operation of the undersampling observation receiver 22 according to one embodiment of the present disclosure. As illustrated, the undersampling observation receiver 22 performs per band filtering of the concurrent multi-band signal from the output of the power amplifier 18 (step 3000). The undersampling observation receiver 22 then undersamples the filtered concurrent multi-band signal at a selected sampling rate such that images or frequency-flipped images of all of the original frequency bands of the concurrent multi-band signal fall within a frequency range of zero to the half of the sampling rate and do not overlap, or alias into, one another (step 3002). In this particular embodiment, the sampling rate is selected such that a frequency-flipped image of at least one of the original frequency bands and images of any remaining original frequency bands of the concurrent multi-band signal fall within a frequency range of zero to half of the sampling rate and do not overlap, or alias into, one another.

Next, the undersampling observation receiver 22 down-converts the frequency-flipped image of the at least one of the original frequency bands and any remaining images of the original frequency bands of the concurrent multi-band signal in the frequency range of zero to half of the sampling rate to baseband (step 3004). In this particular embodiment, the undersampling observation receiver 22 then outputs a complex conjugate of the at least one frequency-flipped images and any remaining images of the original frequency bands of the concurrent multi-band signal as baseband feedback signals for the original frequency bands of the concurrent multi-band signal (step 3006).

Thus far, the sampling rate of the undersampling observation receiver 22 is selected without necessarily considering distortion frequency bands (i.e., frequency bands containing distortion) in the concurrent multi-band signal. FIGS. 9A through 13 describe embodiments in which the sampling rate of the undersampling observation receiver 22 is further selected such that distortion frequency bands up to a desired maximum order of distortion (e.g., third order or fifth order) do not alias into the images or frequency-flipped images of the original frequency bands of the concurrent multi-band signal that fall within a range of zero to half of the sampling rate of the undersampling observation receiver 22.

More specifically, FIGS. 9A and 9B graphically depict selection of a sampling rate of an undersampling observation receiver such that images or frequency-flipped images of all original frequency bands of a concurrent multi-band signal fall within a frequency range of zero to half of the sampling rate and images and frequency-flipped images of distortion frequency bands up to a desired maximum order do not alias into the images or frequency-flipped images of any of the original frequency bands that fall within the frequency range of zero to half of the sampling rate according to one exemplary and non-limiting embodiment of the present disclosure. More specifically, FIG. 9A illustrates original frequency bands 108 and 110 (referred to as original frequency bands A and B, respectively) for a concurrent dual-band signal as well as distortion frequency bands 112 and 114 for third-order intermodulation distortion (referred to herein as distortion frequency bands C and D, respectively). The original frequency bands 108 and 110 are centered at carrier frequencies $f_{C1}$ and $f_{C2}$, respectively. The distortion frequency bands 112 and 114 are centered at $2f_{C1}-f_{C2}$ and $2f_{C2}-f_{C1}$, respectively.

In general, as illustrated in FIG. 9B, the sampling rate ($f_S$) for the undersampling observation receiver 22 is selected such that, in this example, a frequency-flipped image 116 of the first original frequency band 108, an image 118 of the second original frequency band 110, an image 120 of the distortion frequency band 112, and an image 122 of the distortion frequency band 114 fall within a frequency range of zero to half of the sampling rate ($f_S$). The sampling rate ($f_S$) is further selected such that the frequency-flipped image 116 first original frequency band 108 and the image 118 of the second original frequency band 110 do not overlap one another and the images 120 and 122 of the distortion frequency bands 112 and 114 do not alias into the frequency-flipped image 116 and the image 118 of the first and second original frequency bands 108 and 110, respectively. Notably, in this embodiment, the sampling rate ($f_S$) is increased as compared to the embodiments described above to provide an additional frequency zone within the frequency range of zero to half of the sampling rate ($f_S$) in which the images 120 and 122 or frequency-flipped images of the distortion frequency bands 112 and 114 are to fall.

In this particular embodiment, the sampling rate ($f_S$) is selected such that both the image 120 of the distortion frequency band 112 and the image 122 of the distortion frequency band 114 fall fully within the frequency range of zero to $f_S/6$ (i.e., a first zone of the primary sampling rate span which is denoted as sampling rate span 0), the frequency-flipped image 116 of the original frequency band 108 falls fully within the frequency range of $f_S/6$ to $f_S/3$ (i.e., a second zone of sampling rate span 0), and the image 118 of the original frequency band 110 falls fully within the frequency range of $f_S/3$ to $f_S/2$ (i.e., a third zone of sampling rate span 0).

More generally, the sampling rate ($f_S$) of the undersampling observation receiver 22 is selected such that: (1) images or frequency-flipped images of all of the original frequency bands fall within the frequency range of zero to half the sampling rate ($f_S$) and do not overlap with one another and (2) any images and frequency-flipped images of the distortion frequency bands up to the desired maximum order that fall within the frequency range of zero to half of the sampling rate ($f_S$) do not alias into the images or frequency-flipped-images of the original frequency bands that fall within the frequency range of zero to half of the sampling rate. Returning to this example, by sampling the dual-band signal at the selected sampling rate ($f_S$), due to the Nyquist theorem, the undersampling observation receiver 22 obtains an undersampled signal that includes both the frequency-flipped image 116 of the original frequency band 108 and the image 118 of the original frequency band 110 where the images 120 and 122 of the distortion frequency bands 112 and 114 do not alias into the frequency-flipped image 116 or the image 118. Filtering is then used to obtain the frequency-flipped image 116 and the image 118 from the undersampled concurrent dual-band signal. A complex conjugate operation is then performed on the frequency-flipped image 116 to obtain an image of the original frequency band 108. In this manner, the undersampling observation receiver 22 obtains a separate undersampled feedback signal for each of the original frequency bands 108 and 110 of the concurrent dual-band signal.

Before proceeding, it should be noted that, in this example, the separation between the carrier frequencies of the original frequency bands of the concurrent dual-band signal may be defined as:

$$\Delta f = f_{C2} - f_{C1} \approx \frac{2}{3} f_S,$$

where $$f_{C1} \in \left[\left(k_1 + \frac{2}{3}\right)f_S, \left(k_1 + \frac{5}{6}\right)f_S\right],$$

where $k_1$ is an index of the sampling rate span in which the carrier frequency ($f_{C1}$) is located. However, more generally, the separation between the carrier frequencies ($f_{C1}$ and $f_{C2}$) may be defined as:

$$\Delta f = \left(k + \frac{2}{3}\right)f_S, \text{ where } k = 0, 1, 2, 3, \ldots$$

For this exemplary embodiment, the sampling rate ($f_S$) for the undersampling observation receiver 22 is selected according to the following constraint:

$$k_1 f_S \leq 2f_{C1} - f_{C2} - \frac{1}{2} bw_{IM3\_C} \leq 2f_{C1} - f_{C2} + \frac{1}{2} bw_{IM3\_C} \leq \left(k_1 + \frac{1}{4}\right)f_S, \quad (1)$$

$$\left(k_2 + \frac{2}{3}\right)f_S \leq f_{C1} - \frac{1}{2} bw_{IM3\_A} \leq f_{C1} + \frac{1}{2} bw_{IM3\_A} \leq \left(k_2 + \frac{5}{6}\right)f_S, \quad (2)$$

$$\left(k_3 + \frac{1}{3}\right)f_S \leq f_{C2} - \frac{1}{2} bw_{IM3\_B} \leq f_{C2} + \frac{1}{2} bw_{IM3\_B} \leq \left(k_3 + \frac{1}{2}\right)f_S, \quad (3)$$

$$k_4 f_S \leq 2f_{C2} - f_{C1} - \frac{1}{2} bw_{IM3\_D} \leq \quad (4)$$
$$2f_{C2} - f_{C1} + \frac{1}{2} bw_{IM3\_D} \leq \left(k_4 + \frac{1}{4}\right)f_S,$$

with the following constraints on $k_1$, $k_2$, $k_3$, and $k_4$:

$$\left(k_2 + \frac{2}{3}\right) - k_1 = k + \frac{2}{3}, \quad (5)$$

$$\left(k_3 + \frac{1}{3}\right) - \left(k_2 + \frac{2}{3}\right) = k + \frac{2}{3}, \text{ and} \quad (6)$$

$$k_4 - \left(k_3 + \frac{1}{3}\right) = k + \frac{2}{3}, \quad (7)$$

where k is a non-negative integer number. The three constraints on $k_1$, $k_2$, $k_3$, and $k_4$ are positive integers and can be rewritten as:

$$k_2 = k_1 + k, \quad (8)$$
$$k_3 = k_2 + k + 1, \text{ and} \quad (9)$$
$$k_4 = k_3 + k + 1. \quad (10)$$

More generally, assume that the frequency axis is divided into consecutive frequency zones of bandwidth $f_S/6$ with corresponding indices 0, 1, 2, etc. Thus, frequency zone 0 refers to the frequency range of 0 to $f_S/6$, frequency zone 1 refers to the frequency range of $f_S/6$ to $f_S/2$, etc. Further, the distortion signals in either frequency band A, B, C, or D falls into a single frequency zone and does not occupy two frequency zones. In other words, the following constraints are satisfied:

$$\frac{k_1}{6} f_S \leq 2f_{C1} - f_{C2} - \frac{1}{2} bw_{IM3\_C} \leq \quad (11)$$
$$2f_{C1} - f_{C2} + \frac{1}{2} bw_{IM3\_C} \leq (k_1 + 1)\frac{f_S}{6},$$

-continued $$\frac{k_2}{6}f_S \le f_{C1} - \frac{1}{2}bw_{IM3\_A} \le f_{C1} + \frac{1}{2}bw_{IM3\_A} \le (k_2+1)\frac{f_S}{6}, \quad (12)$$

$$\frac{k_3}{6}f_S \le f_{C2} - \frac{1}{2}bw_{IM3\_B} \le f_{C2} + \frac{1}{2}bw_{IM3\_B} \le (k_3+1)\frac{f_S}{6}, \text{ and} \quad (13)$$

$$\frac{k_4}{6}f_S \le 2f_{C2} - f_{C1} - \frac{1}{2}bw_{IM3\_D} \le \quad (14)$$

$$2f_{C2} - f_{C1} + \frac{1}{2}bw_{IM3\_D} \le (k_4+1)\frac{f_S}{6},$$

where $$k_2 = k_1 + n, \quad (15)$$

$$k_3 = k_2 + n, \text{ and} \quad (16)$$

$$k_4 = k_3 + n, \quad (17)$$

where n is a non-negative integer number.

Then, if the frequency zone indices that frequency bands A, B, C, and D occupy are denoted as $id_{band\_A}$, $id_{band\_B}$, $id_{band\_C}$, and $id_{band\_D}$, respectively, then the frequency zone indices that their images occupy in the frequency range of zero to the sampling rate ($f_S$) are denoted as $id_{imag\_A}$, $id_{imag\_B}$, $id_{imag\_C}$, and $id_{imag\_D}$ and can be defined as:

$$id_{imag\_A} = (id_{band\_A} \bmod 6),$$

$$id_{imag\_B} = (id_{band\_B} \bmod 6),$$

$$id_{imag\_C} = (id_{band\_C} \bmod 6), \text{ and}$$

$$id_{imag\_D} = (id_{band\_D} \bmod 6).$$

The frequency zone indices of the frequency-flipped images in the frequency range of zero to the sampling rate ($f_S$) are denoted as $id_{flip\_imag\_A}$, $id_{flip\_imag\_B}$, $id_{flip\_imag\_C}$, and $id_{flip\_imag\_D}$ and can be defined as:

$$id_{flip\_imag\_A} = (-id_{band\_A} \bmod 6),$$

$$id_{flip\_imag\_B} = (-id_{band\_B} \bmod 6),$$

$$id_{flip\_imag\_C} = (-id_{band\_C} \bmod 6), \text{ and}$$

$$id_{flip\_imag\_D} = (-id_{band\_D} \bmod 6).$$

With the above assumptions and notations, the general constraints can be expressed as:

Constraint 1: The image of original frequency band A or the frequency-flipped version of the original frequency band A does not overlap with images or frequency-flipped images of any other original or distortion frequency band. Constraint 1 can be expressed as:

$id_{imag\_A} \ne id_{imag\_B}$ AND $id_{imag\_A} \ne id_{imag\_C}$ AND $id_{imag\_A} \ne id_{imag\_D}$ AND $id_{imag\_A} \ne id_{flip\_imag\_A}$ AND $id_{imag\_A} \ne id_{flip\_imag\_B}$ AND $id_{imag\_A} \ne id_{flip\_imag\_C}$ AND $id_{imag\_A} \ne id_{flip\_imag\_D}$ AND

OR $id_{flip\_imag\_A} \ne id_{imag\_A}$ AND $id_{flip\_imag\_A} \ne id_{imag\_B}$ AND $id_{flip\_imag\_A} \ne id_{imag\_C}$ AND $id_{flip\_imag\_A} \ne id_{imag\_D}$ AND $id_{flip\_imag\_A} \ne id_{flip\_imag\_B}$ AND $id_{flip\_imag\_A} \ne id_{flip\_imag\_C}$ AND $id_{flip\_imag\_A} \ne id_{flip\_imag\_D}$ AND Constraint 2: The image of original frequency band B or the frequency-flipped version of the original frequency band B does not overlap with images or frequency-flipped images of any other original or distortion frequency band. Constraint 2 can be expressed as:

$id_{imag\_B} \ne id_{imag\_A}$ AND $id_{imag\_B} \ne id_{imag\_C}$ AND $id_{imag\_B} \ne id_{imag\_D}$ AND $id_{imag\_B} \ne id_{flip\_imag\_A}$ AND $id_{imag\_B} \ne id_{flip\_imag\_B}$ AND $id_{imag\_B} \ne id_{flip\_imag\_C}$ AND $id_{imag\_B} \ne id_{flip\_imag\_D}$ AND

OR $id_{flip\_imag\_B} \ne id_{imag\_A}$ AND $id_{flip\_imag\_B} \ne id_{imag\_B}$ AND $id_{flip\_imag\_B} \ne id_{imag\_C}$ AND $id_{flip\_imag\_B} \ne id_{imag\_D}$ AND $id_{flip\_imag\_B} \ne id_{flip\_imag\_A}$ AND $id_{flip\_imag\_B} \ne id_{flip\_imag\_C}$ AND $id_{flip\_imag\_B} \ne id_{flip\_imag\_D}$.

In the above, AND and OR denote logical AND and logical OR operations, respectively.

While in the embodiment above the separation between the carrier frequencies of the dual-band signal is defined as:

$$\Delta f = \left(k + \frac{2}{3}\right)f_S, \text{ where } k = 0, 1, 2, 3, \ldots,$$

the separation between the carrier frequencies is not limited thereto. In another embodiment, for the dual-band third-order case, the separation between the carrier frequencies of the dual-band signal may be defined as:

$$\Delta f = \left(k + \frac{1}{2} \pm \frac{1}{6}\right)f_S, \text{ where } k = 0, 1, 2, 3, \ldots$$

As long as this equation for the separation between the carrier frequencies is satisfied, a valid frequency plan is obtained in which: (1) images or frequency-flipped images of all of the original frequency bands fall within the frequency range of zero to half the sampling rate ($f_S$) and do not overlap with one another and (2) any images and frequency-flipped images of the distortion frequency bands up to the third-order that fall within the frequency range of zero to half of the sampling rate ($f_S$) do not alias into the images or frequency-flipped-images of the original frequency bands that fall within the frequency range of zero to half of the sampling rate ($f_S$).

In the constraints above, it is not required that only images of the signals in the original frequency bands A and B in the frequency range of zero to half of the sampling rate ($f_S$). A combination of the images and the frequency-flipped images is acceptable to provide maximum flexibility in support of the carrier frequencies based on a single design.

FIG. 10 illustrates a process for selecting a sampling rate for the undersampling observation receiver 22 such that images or frequency-flipped images of all original frequency bands of a concurrent multi-band signal fall within a frequency range of zero to half of the sampling rate and images and frequency-flipped images of distortion up to a desired maximum order do not alias into the images or frequency-flipped images of the original frequency bands that fall within the frequency range of zero to half of the sampling rate according to one embodiment of the present disclosure. Notably, in this embodiment, the concurrent multi-band signal is preferably a concurrent dual-band input signal. First, carrier frequency values and corresponding bandwidth values are obtained for all original frequency bands of the concurrent multi-band signal (step 4000).

Based on the carrier frequency values and the bandwidth values for the concurrent multi-band signal, a sampling rate for the undersampling observation receiver 22 is selected such that images or frequency-flipped images of all of the original frequency bands of the concurrent multi-band signal fall within a frequency range of zero to the half of the sampling rate and do not overlap, or alias into, one another and no images or frequency-flipped images of any distortion frequency band up to a desired maximum order aliases into the images or frequency-flipped images of the original frequency bands that fall within the frequency range of zero to half of the sampling rate (step 4002). In one preferred embodiment, the sampling rate is selected such that a frequency-flipped image of at least one of the original frequency bands and images of any remaining original frequency bands of the concurrent multi-band signal fall within the frequency range of zero to half of the sampling rate and do not overlap, or alias into, one another and no images or frequency-flipped images of any of the distortion frequency bands up to the desired maximum order alias into the images or frequency-flipped images of the original frequency bands that fall into the frequency range of zero to half of the sampling rate.

The conjugate functions of the undersampling observation receiver 22 are then configured according to the selected sampling rate (step 4004). Specifically, based on the selected sampling rate, for each original frequency band, a determination is made as to whether an image or a frequency-flipped image of the original frequency band falls within the frequency range of zero to half of the sampling rate. If a frequency-flipped image of the original frequency band falls within the frequency range of zero to half of the sampling rate, then the corresponding conjugate function is configured to compute the complex conjugate of the frequency-flipped image to thereby provide an image of the corresponding original frequency band. In addition, the sampling rate of the undersampling observation receiver 22 is configured as the selected sampling rate (step 4006).

FIG. 11 illustrates a process for selecting a sampling rate for the undersampling observation receiver 22 such that either an image or a frequency-flipped image of all original frequency bands of a concurrent multi-band signal fall within a frequency range of zero to half of the sampling rate and images and frequency-flipped images of distortion up to a desired maximum order do not alias into the images or frequency-flipped images of any of the original frequency bands that fall within the frequency range of zero to half of the sampling rate according to another embodiment of the present disclosure. Notably, in this embodiment, the concurrent multi-band signal is preferably a concurrent dual-band input signal. First, carrier frequency values and corresponding bandwidth values are obtained for all original frequency bands of the concurrent multi-band signal (step 5000). Based on the carrier frequency values and the bandwidth values for the concurrent multi-band signal, a first set of sampling rate values are determined that: (1) result in images or frequency-flipped images of all of the original frequency bands of the concurrent multi-band signal that fall within a frequency range of zero to half of the sampling rate and do not overlap, or alias into, one another and (2) ensure that no images or frequency-flipped images of distortion frequency bands up to a desired maximum order alias into the images or frequency-flipped images of the original frequency bands of the concurrent multi-band signal that fall within the frequency range of zero to half of the sampling rate (step 5002).

A second set of sampling rate values that are permissible for undersampling the concurrent multi-band signal are determined (step 5004). The second set of sampling rate values is a set of sampling rate values that satisfy known criteria required for undersampling. Sampling rate values that are both in the first set of sampling rate values and the second set of sampling rate values are identified as potential sampling rate values for the undersampling observation receiver 22 (step 5006). Optionally, if it is desired to select a sampling rate value that is suitable for different concurrent multi-band signals (i.e., concurrent multi-band signals having different or tunable carrier frequencies and/or frequency band bandwidths), steps 5000 through 5006 may be repeated for each different multi-band signal (step 5008). Alternatively, a desired sampling rate may be separately selected for each such different concurrent multi-band signal or groups thereof.

The sampling rate for the undersampling observation receiver 22 is then selected from the potential sampling rate values identified in step 5006 (step 5010). In one preferred embodiment, the sampling rate is selected such that a frequency-flipped image of at least one of the original frequency bands and images of any remaining original frequency bands of the concurrent multi-band signal fall within a frequency range of zero to half of the sampling rate and do not overlap, or alias into, one another and no images or frequency-flipped images of the distortion frequency bands alias into the frequency-flipped image of the at least one of the original frequency bands and images of any remaining original frequency bands that fall within the frequency range of zero to half of the sampling rate.

The conjugate functions of the undersampling observation receiver 22 are then configured according to the selected sampling rate (step 5012). Specifically, based on the selected sampling rate, for each original frequency band, a determination is made as to whether an image or a frequency-flipped image of the original frequency band falls within the frequency range of zero to half of the sampling rate. If a frequency-flipped image of the original frequency band falls within the frequency range of zero to half of the sampling rate, then the corresponding conjugate function is configured to compute the complex conjugate of the frequency-flipped image to thereby provide an image of the corresponding original frequency band. Otherwise, the conjugate function outputs the image of the corresponding frequency band or is bypassed. In addition, the sampling rate of the undersampling observation receiver 22 is configured as the selected sampling rate (step 5014).

FIGS. 12A and 12B graphically depict selection of a sampling rate of the undersampling observation receiver 22 such that either an image or a frequency-flipped image of all original frequency bands of a concurrent multi-band signal fall within a frequency range of zero to half of the sampling rate and images and frequency-flipped images of distortion up to a desired maximum order do not alias into the images or frequency-flipped images of any of the original frequency bands that fall within the frequency range of zero to half of the sampling rate according to another exemplary and non-limiting embodiment of the present disclosure. More specifically, FIG. 12A illustrates original frequency bands 124 and 126 (referred to as original frequency bands A and B, respectively) for a concurrent dual-band signal as well as distortion frequency bands 128 and 130 for third-order intermodulation distortion (referred to herein as distortion frequency bands C and D, respectively). The original frequency bands 124 and 126 are centered at carrier frequencies $f_{C1}$ and $f_{C2}$, respectively. The distortion frequency bands 128 and 130 are centered at $2f_{C1}-f_{C2}$ and $2f_{C2}-f_{C1}$, respectively.

In general, as illustrated in FIG. 12B, the sampling rate for the undersampling observation receiver 22 is selected such that, in this example, an image 132 of the first original frequency band 124, a frequency-flipped image 134 of the second original frequency band 126, an image 136 of the distortion frequency band 128, and an image 138 of the distortion frequency band 130 fall within a frequency range of zero to half of the sampling rate ($f_S$). The sampling rate ($f_S$) is further selected such that the image 132 of the first original frequency band 124 and the frequency-flipped image 134 of the second original frequency band 126 do not overlap one another and the images 136 and 138 of the distortion frequency bands 128 and 130 do not overlap the image 132 or the frequency-flipped image 134 of the first and second original frequency bands 124 and 126, respectively. Notably, in this embodiment, the sampling rate ($f_S$) is increased to provide an additional frequency zone within the frequency range of zero to half of the sampling rate ($f_S$) in which the images or frequency-flipped images of the distortion frequency bands 128 and 130 are to fall.

In this particular embodiment, the sampling rate ($f_S$) is selected such that both the image 136 of the distortion frequency band 128 and the image 138 of the distortion frequency band 130 fall fully within the frequency range of zero $f_S/6$ (i.e., a first zone of the primary sampling rate span which is denoted as sampling rate span 0), the frequency-flipped image 134 of the original frequency band 126 falls fully within the frequency range of $f_S/6$ to $f_S/3$ (i.e., a second zone of sampling rate span 0), and the image 132 of the original frequency band 124 falls fully within the frequency range of $f_S/3$ to $f_S/2$ (i.e., a third zone of sampling rate span 0).

FIG. 13 graphically depicts selection of a sampling rate of the undersampling observation receiver 22 such that images or frequency-flipped images of all original frequency bands of a concurrent multi-band signal fall within a frequency range of zero to half of the sampling rate and images and frequency-flipped images of distortion up to a desired maximum order do not alias into the images or frequency-flipped images of any of the original frequency bands that fall within the frequency range of zero to half of the sampling rate according to one exemplary and non-limiting embodiment of the present disclosure. In this example, up to fifth-order intermodulation distortion is considered. More specifically, in this example, the concurrent multi-band signal is a concurrent dual-band signal having original frequency bands A and B centered at carrier frequencies $f_{c1}$ and $f_{c2}$. In addition, when considering up to fifth-order intermodulation distortion, there are four distortion frequency bands C, D, E, and F centered at frequencies $2f_{C1}-f_{C2}$, $2f_{C2}-f_{C1}$, $3f_{C1}-2f_{C2}$, and $3f_{C2}-2f_{c1}$, respectively.

As illustrated in FIG. 13, the sampling rate is selected such that an image 140 of the original frequency band A falls fully within the frequency range of $f_S/4$ to $3f_S/8$ and a frequency-flipped image 142 of the original frequency band B falls fully within the frequency range of $3f_S/8$ to $f_S/2$. In addition, for each of the distortion frequency bands C, D, E, and F, either an image or a frequency-flipped image of the distortion frequency band falls within the frequency range of zero to $f_S/4$. In this manner, no image or frequency-flipped image of the distortion frequency bands aliases into the desired image 140 and frequency-flipped image 142. Specifically, in this example, an image 144 of the distortion frequency band C and an image 146 of the distortion frequency band F fall fully within the frequency range of zero to $f_S/8$, and a frequency-flipped image 148 of the distortion frequency band D and a frequency-flipped image 150 of the distortion frequency band E fall fully within the frequency range of $f_S/8$ to $f_S/4$.

In one embodiment, the concurrent multi-band signal is a concurrent dual-band signal and distortion up to the fifth order is considered. In this embodiment, a separation between the carrier frequencies of the concurrent dual-band signal may be constrained to:

$$\Delta f = \left(k + \frac{1}{2} \pm \frac{1}{4}\right)f_S, \text{ where } k = 0, 1, 2, 3, \ldots$$

As long as this equation for the separation between the carrier frequencies is satisfied, a valid frequency plan is obtained in which: (1) images or frequency-flipped images of all of the original frequency bands fall within the frequency range of zero to half the sampling rate ($f_S$) and do not overlap with one another and (2) any images and frequency-flipped images of the distortion frequency bands up to the fifth order that fall within the frequency range of zero to half of the sampling rate ($f_S$) do not alias into the image or frequency-flipped images of the original frequency bands that fall within the frequency range of zero to half of the sampling rate ($f_S$).

In another embodiment, the concurrent multi-band signal is a concurrent dual-band signal and distortion up to the fifth order is considered. In this embodiment, a separation between the carrier frequencies of the concurrent dual-band signal may be constrained to:

$$\Delta f = \left(k + \frac{3}{8}\right)f_S, \text{ where } k = 0, 1, 2, 3, \ldots,$$

and the location of the original frequency band A is constrained to frequency zone 8n or zone 8n+4, where n=0, 1, 2, 3, .... Note that frequency zone zero is 0 to $f_S/8$, frequency zone 1 is $f_S/8$ to $f_S/4$, etc. As long as these constraints are satisfied for the separation between the carrier frequencies and the location of the original frequency band A, a valid frequency plan is obtained in which: (1) images or frequency-flipped images of all of the original frequency bands fall within the frequency range of zero to half the sampling rate ($f_S$) and do not overlap with one another and (2) any images and frequency-flipped images of the distortion frequency bands up to the fifth order that fall within the frequency range of zero to half of the sampling rate ($f_S$) do not alias into the image or frequency-flipped images of the original frequency bands that fall within the frequency range of zero to half of the sampling rate ($f_S$).

In yet another embodiment, the concurrent multi-band signal is a concurrent dual-band signal and distortion up to the fifth order is considered. In this embodiment, a separation between the carrier frequencies of the concurrent dual-band signal may be constrained to:

$$\Delta f = \left(k + \frac{5}{8}\right) f_S, \text{ where } k = 0, 1, 2, 3, \ldots ,$$

and the location of the original frequency band A is constrained to frequency zone 8n+7 or zone 8n+3, where n=0, 1, 2, 3, .... Note that frequency zone zero is 0 to $f_S/8$, frequency zone 1 is $f_S/8$ to $f_S/4$, etc. As long as these constraints are satisfied for the separation between the carrier frequencies and the location of the original frequency band A, a valid frequency plan is obtained in which: (1) images or frequency-flipped images of all of the original frequency bands fall within the frequency range of zero to half the sampling rate ($f_S$) and do not overlap with one another and (2) any images and frequency-flipped images of the distortion frequency bands up to the fifth order that fall within the frequency range of zero to half of the sampling rate ($f_S$) do not alias into the image or frequency-flipped images of the original frequency bands that fall within the frequency range of zero to half of the sampling rate ($f_S$).

The following acronyms are used throughout this disclosure.
ADC Analog-to-Digital Converter
ASIC Application Specific Integrated Circuit
CDMA Code Division Multiple Access
DC Direct Current
DSP Digital Signal Processor
IC Integrated Circuit
IM3 Third-Order Intermodulation Distortion
IM5 Fifth-Order Intermodulation Distortion
OFDM Orthogonal Frequency Division Multiplexing
PA Power Amplifier
PD Predistorter
QAM Quadrature Amplitude Modulation Those skilled in the art will recognize improvements and modifications to the preferred embodiments of the present disclosure. All such improvements and modifications are considered within the scope of the concepts disclosed herein and the claims that follow.

What is claimed is:

1. A system comprising:
an observation receiver configured to:
receive a concurrent multi-band signal output by a power amplifier, the concurrent multi-band signal having a plurality of original frequency bands;
undersample the concurrent multi-band signal at a select sampling rate to provide an undersampled multi-band signal, where the select sampling rate is such that a frequency-flipped image of at least one of the plurality of original frequency bands of the concurrent multi-band signal and images of any remaining original frequency bands of the plurality of original frequency bands fall within a frequency range of zero to half of the select sampling rate and do not overlap one another; and
process the undersampled multi-band signal to provide a plurality of feedback signals for the plurality of original frequency bands of the concurrent multi-band signal, each feedback signal of the plurality of feedback signals corresponding to a different one of the plurality of original frequency bands; and
an adaptation sub-system configured to adaptively configure a predistortion sub-system that compensates for nonlinearity of the power amplifier based on the plurality of feedback signals.

2. The system of claim 1 wherein the modulated concurrent multi-band signal is a concurrent dual-band signal.

3. The system of claim 1 wherein the plurality of original frequency bands is three or more frequency bands.

4. The system of claim 1 wherein, in order to adaptively configure the predistortion sub-system, the adaptation sub-system is further configured to, for each original frequency band of the at least one of the plurality of original frequency bands:
downconvert the frequency-flipped image for the original frequency band in the frequency range of zero to half of the select sampling rate to baseband to provide a frequency-flipped baseband feedback signal for the original frequency band; and
providing a complex conjugate of the frequency-flipped baseband feedback signal for the original frequency band as a baseband feedback signal for the original frequency band.

5. The system of claim 4 wherein, in order to adaptively configure the predistortion sub-system, the adaptation sub-system is further configured to, for each original frequency band of the any remaining original frequency bands of the plurality of original frequency bands:
downconvert the image for the original frequency band in the frequency range of zero to half of the select sampling rate to baseband to provide a baseband feedback signal for the original frequency band.

6. The system of claim 5 wherein, in order to adaptively configure the predistortion sub-system, the adaptation sub-system is further configured to adaptively configure the predistortion sub-system based on the baseband feedback signals for the plurality of original frequency bands.

7. The system of claim 6 wherein, in order to adaptively configure the predistortion sub-system based on the baseband feedback signals for the plurality of original frequency bands, the adaptation sub-system is further configured to, for each original frequency band of the plurality of original frequency bands, adaptively configure a separate predistorter for the original frequency band in the predistortion sub-system based on the baseband feedback signal for the original frequency band.

8. The system of claim 6 wherein in order to adaptively configure the predistortion sub-system based on the baseband feedback signals for the plurality of original frequency bands, the adaptation sub-system is further configured to:
tune each of the baseband feedback signals to a different intermediate frequency to provide a plurality of intermediate frequency feedback signals;
combine the plurality of intermediate frequency feedback signals to provide a combined feedback signal; and
adaptively configure a combined predistorter for the plurality of original frequency bands in the predistortion sub-system based on the combined feedback signal for the plurality of original frequency bands.

9. The system of claim 1 wherein the select sampling rate is further such that images and frequency-flipped images of distortion frequency bands up to a desired maximum order do not alias into the frequency-flipped image of the at least one of the plurality of original frequency bands or the images of the any remaining original frequency bands of the plurality of original frequency bands that fall within the frequency range of zero to half of the select sampling rate.

10. The system of claim 1 wherein the select sampling rate is further such that, for each distortion frequency band of a plurality of distortion frequency bands up to a desired maximum order, either an image or a frequency-flipped image of the distortion frequency band falls within the frequency range of zero to half of the select sampling rate and does not alias into the frequency-flipped image of the at least one of the plurality of original frequency bands or the images of the any remaining original frequency bands of the plurality of original frequency bands that fall within the frequency range of zero to half of the select sampling rate.

11. The system of claim 10 wherein the image or the frequency-flipped image for one of the plurality of distortion frequency bands that falls within the frequency range of zero to half of the select sampling rate overlaps the image or the frequency-flipped image for another one of the plurality of distortion frequency bands that falls within the frequency range of zero to half of the select sampling rate.

12. The system of claim 10 wherein the concurrent multi-band signal is a concurrent dual-band signal.

13. The system of claim 10 wherein the desired maximum order is at least third-order distortion.

14. The system of claim 10 wherein the desired maximum order is one of a group consisting of: third-order and fifth-order.

15. A method of operation of a transmitter comprising:
undersampling a concurrent multi-band signal having a plurality of original frequency bands output by a power amplifier at a select sampling rate to provide an undersampled multi-band signal, where the select sampling rate is such that a frequency-flipped image of at least one of the plurality of original frequency bands of the concurrent multi-band signal and images of any remaining frequency bands of the plurality of original frequency bands fall within a frequency range of zero to half of the select sampling rate and do not overlap one another;
processing the undersampled multi-band signal to provide a plurality of feedback signals for the plurality of original frequency bands of the concurrent multi-band signal, each feedback signal of the plurality of feedback signals corresponding to a different one of the plurality of original frequency bands; and
adaptively configuring a predistortion sub-system that compensates for non-linearity of the power amplifier based on the plurality of feedback signals.

16. A method of configuring a sampling rate for an undersampling observation receiver in a feedback path for adaptively configuring a predistortion sub-system to compensate for non-linearity of a power amplifier, comprising:
obtaining a plurality of carrier frequency values and a corresponding plurality of bandwidth values for a plurality of original frequency bands of a concurrent multi-band signal to be amplified by the power amplifier; and
based on the plurality of carrier frequency values and the corresponding plurality of bandwidth values, selecting a sampling rate value for the undersampling observation receiver, where the sampling rate value selected for the undersampling observation receiver is such that a frequency-flipped image of at least one of the plurality of original frequency bands of the concurrent multi-band signal and images of any remaining original frequency bands of the plurality of original frequency bands fall within a frequency range of zero to half of the sampling rate value and do not overlap one another.

17. The method of claim 16 further comprising configuring a sampling rate of the undersampling observation receiver as the sampling rate selected for the undersampling observation receiver.

18. The method of claim 16 wherein selecting the sampling rate value comprises:
determining a first set of sampling rate values that result in images or frequency-flipped images of the plurality of original frequency bands falling within the frequency range of zero to half of the sampling rate value;
determining a second set of sampling rate values that are permissible for undersampling of the concurrent multi-band signal;
identifying sample rate values that are within both the first set of sampling rate values and the second set of sampling rate values as potential sampling rate values for the undersampling observation receiver; and
selecting one of the potential sampling rate values as the sampling rate value for the undersampling observation receiver such that the frequency-flipped image of the at least one of the plurality of original frequency bands of the concurrent multi-band signal and the images of the any remaining original frequency bands of the plurality of original frequency bands fall within the frequency range of zero to half of the sampling rate value and do not overlap one another.

19. The method of claim 16 wherein selecting the sampling rate value comprises selecting the sampling rate value for the undersampling observation receiver such that:
the frequency-flipped image of the at least one of the plurality of original frequency bands of the concurrent multi-band signal and the images of the any remaining original frequency bands of the plurality of original frequency bands fall within the frequency range of zero to half of the sampling rate value and do not overlap one another; and
neither images nor frequency-flipped images of distortion frequency bands up to a desired maximum order alias into the frequency-flipped image of the at least one of the plurality of original frequency bands of the concurrent multi-band signal that falls within the frequency range of zero to half of the sampling rate value or the images of the any remaining original frequency bands of the plurality of original frequency bands that fall within the frequency range of zero to half of the sampling rate value.

20. The method of claim 19 wherein selecting the sampling rate value comprises:
determining a first set of sampling rate values that result in images or frequency-flipped images of the plurality of original frequency bands falling within a frequency range of zero to half of the sampling rate value and ensure that images or frequency-flipped images of the distortion frequency bands do not alias into the images or the frequency-flipped images of the plurality of original frequency bands falling within the frequency range of zero to half of the sampling rate value;
determining a second set of sampling rate values that are permissible for undersampling of the concurrent multi-band signal;
identifying sample rate values that are within both the first set of sampling rate values and the second set of sampling rate values as potential sampling rate values for the undersampling observation receiver; and selecting one of the potential sampling rate values as the sampling rate value for the undersampling observation receiver such that:
the frequency-flipped image of the at least one of the plurality of original frequency bands of the concurrent multi-band signal and the images of the any remaining original frequency bands of the plurality of original frequency bands fall within the frequency range of zero to half of the sampling rate value and do not overlap one another; and
the distortion frequency bands up to the desired maximum order do not alias into the frequency-flipped image of the at least one of the plurality of original frequency bands of the concurrent multi-band signal and the images of the any remaining original frequency bands of the plurality of original frequency bands that fall within the frequency range of zero to half of the sampling rate value.

* * * * *

UNITED STATES PATENT AND TRADEMARK OFFICE
CERTIFICATE OF CORRECTION

PATENT NO. : 8,634,494 B2
APPLICATION NO. : 13/423846
DATED : January 21, 2014
INVENTOR(S) : Bai It is certified that error appears in the above-identified patent and that said Letters Patent is hereby corrected as shown below:

In the Specification

In Column 7, Line 27, delete "$bw_{IM3\_A} = bW_A + 2\max(bw_A + bw'_B)$," and insert -- $bw_{IM3\_A} = bw_A + 2\max(bw_A + bw_B)$ --, therefor.

In Column 7, Line 29, delete "$bw_{IM3\_B} = bW_B + 2\max(bw_A + bw'_B)$," and insert -- $bw_{IM3\_B} = bw_B + 2\max(bw_A + bw_B)$ --, therefor.

In Column 11, Line 37, delete "($\chi_{C2} = 2\pi f_{C2}$)" and insert -- ($\omega_{C1} = 2\pi f_{C1}$) --, therefor.

In Column 14, Line 16, delete "($Sp_{PD\_BB1}$)." and insert -- ($S_{PD\_BB1}$). --, therefor.

In Column 14, Line 37, delete "($S_{PDBB2}$)." and insert -- ($S_{PD\_BB2}$). --, therefor.

In Column 14, Line 42, delete "($S_{PD\_BB2}$)." and insert -- ($S_{PD\_BB2\_F}$). --, therefor.

In Column 21, Line 63, delete "AND".

In Column 22, Line 3, delete "$id_{iflip\_imag\_A} \neq id_{imag\_C}$ AND," and insert -- $id_{iflip\_imag\_A} \neq id_{imag\_C}$ AND --, therefor.

In Column 22, Line 7, delete "$id_{flip\_imag\_A} \neq id_{flip\_imag\_B}$ AND" and insert -- $id_{iflip\_imag\_A} \neq id_{flip\_imag\_B}$ AND --, therefor.

Signed and Sealed this
Fifth Day of August, 2014

Michelle K. Lee
*Deputy Director of the United States Patent and Trademark Office*

CERTIFICATE OF CORRECTION (continued)
U.S. Pat. No. 8,634,494 B2

In Column 22, Line 10, delete "AND".

In Column 22, Line 28, delete "AND".

In Column 22, Line 35, delete "$id_{flip\_imag\_B} \neq id_{imag\_C} \text{ AND}$," and insert -- $id_{iflip\_imag\_B} \neq id_{imag\_C} \text{ AND}$ --, therefor.

In Column 22, Line 38, delete "$id_{flip\_imag\_B} \neq id_{flip\_imag\_A} \text{ AND}$," and insert -- $id_{iflip\_imag\_B} \neq id_{flip\_imag\_A} \text{ AND}$ --, therefor.

In Column 27, Line 13, delete "K-0,1,2,3...," and insert -- K=0,1,2,3..., --, therefor.

In the Claims

In Column 28, Line 52, in Claim 8, delete "wherein in" and insert -- wherein, in -- , therefor.